US006811658B2

United States Patent
Hongo et al.

(10) Patent No.: US 6,811,658 B2
(45) Date of Patent: Nov. 2, 2004

(54) APPARATUS FOR FORMING INTERCONNECTS

(75) Inventors: Akihisa Hongo, Yokohama (JP); Naoki Matsuda, Yokohama (JP); Kanji Ohno, Sagamihara (JP); Ryoichi Kimizuka, Tokyo (JP)

(73) Assignee: Ebara Corporation, Tokyo (JP)

( * ) Notice: Subject to any disclaimer, the term of this patent is extended or adjusted under 35 U.S.C. 154(b) by 308 days.

(21) Appl. No.: 09/891,472

(22) Filed: Jun. 27, 2001

(65) Prior Publication Data

US 2002/0088709 A1 Jul. 11, 2002

(30) Foreign Application Priority Data

| Jun. 29, 2000 | (JP) | ..................................... | 2000-196993 |
| Nov. 22, 2000 | (JP) | ..................................... | 2000-356590 |
| Mar. 16, 2001 | (JP) | ..................................... | 2001-077154 |
| Mar. 16, 2001 | (JP) | ..................................... | 2001-077155 |

(51) Int. Cl.[7] ............................................. C25D 17/00
(52) U.S. Cl. ................... 204/198; 204/212; 204/224 R; 204/224 M; 204/269; 118/423
(58) Field of Search ............................ 204/198, 224 R, 204/224 M, 212, 269; 118/423

(56) References Cited

U.S. PATENT DOCUMENTS

| 3,932,236 | A | * | 1/1976 | Wada et al. ................. 148/113 |
| 4,242,154 | A | * | 12/1980 | Pilling ........................ 148/16.7 |
| 6,267,853 | B1 | | 7/2001 | Dordi et al. |
| 6,294,059 | B1 | | 9/2001 | Hongo et al. |
| 6,297,154 | B1 | * | 10/2001 | Gross et al. ................. 438/663 |
| 6,352,467 | B1 | | 3/2002 | Somekh et al. |
| 6,508,920 | B1 | * | 1/2003 | Ritzdorf et al. ............. 204/194 |
| 6,572,755 | B2 | * | 6/2003 | Emesh et al. ........... 204/198 X |

* cited by examiner

Primary Examiner—Donald R Valentine
(74) Attorney, Agent, or Firm—Wenderoth, Lind & Ponack, L.L.P.

(57) ABSTRACT

A method and apparatus for forming interconnects embedding a metal such as copper (Cu) into recesses for interconnects formed on the surface of a substrate such as a semiconductor substrate. The method includes providing a substrate having fine recesses formed in the surface, subjecting the surface of the substrate to plating in a plating liquid, and subjecting the plated film formed on the surface of the substrate to electrolytic etching in an etching liquid.

20 Claims, 23 Drawing Sheets

F I G. 3
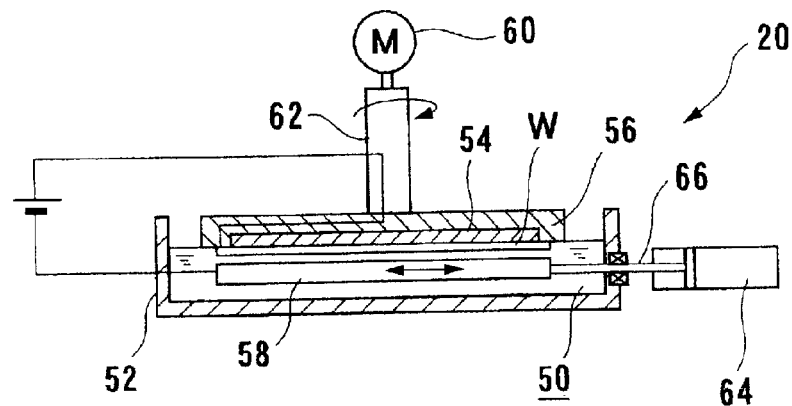
F I G. 4
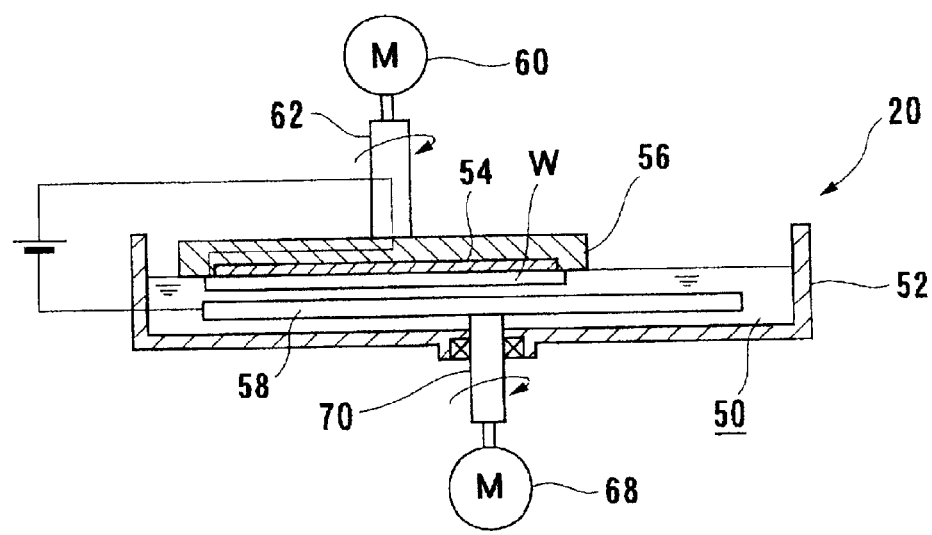

F I G. 1 0
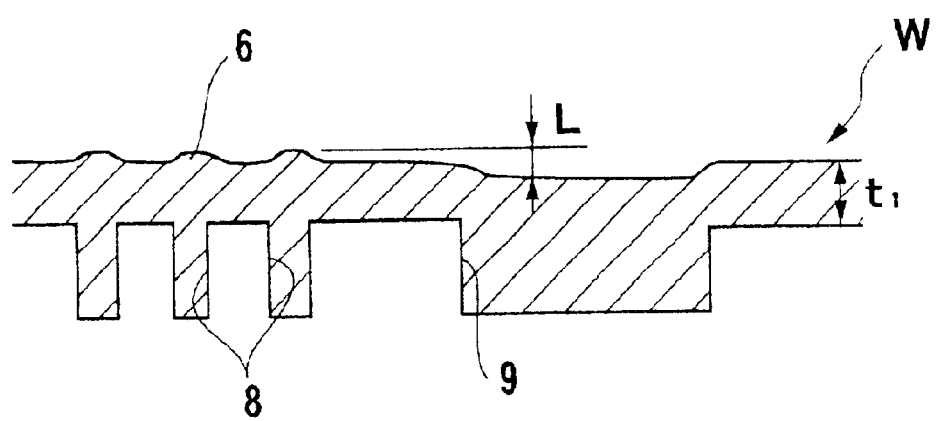

F I G. 1 3
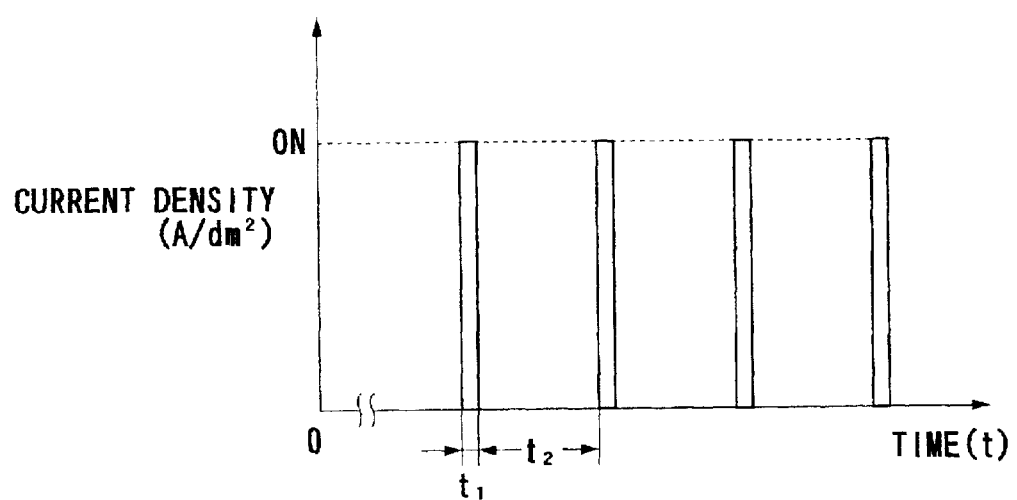

APPARATUS FOR FORMING INTERCONNECTS

BACKGROUND OF THE INVENTION

1. Field of the Invention

This invention relates to a method and an apparatus for forming interconnects, and a polishing liquid and a polishing method, and more particularly to a method for forming interconnects by embedding a metal such as copper (Cu) in recesses for interconnects formed in the surface of a semiconductor substrate, and to a polishing liquid and a polishing method for use in such method and apparatus.

2. Description of the Related Art

In recent years, instead of using aluminum or aluminum alloys as a material for forming interconnection circuits on a semiconductor substrate, there is an eminent movement towards using copper (Cu) which has a low electric resistance and high electro-migration resistance. Copper interconnects are generally formed by filling copper into fine recesses formed in the surface of a substrate. There are known various techniques for producing such copper interconnects, including CVD, sputtering, and plating. According to any such technique, a copper is deposited on the substantially entire surface of a substrate, followed by removal of unnecessary copper by chemical mechanical polishing (CMP).

FIGS. 32A through 32C illustrate, in a sequence of process steps, an example of producing such a substrate W having copper interconnects. As shown in FIG. 32A, an insulating film 2 of an oxide $SiO_2$ or of a low-K material is deposited on a conductive layer 1a formed on a semiconductor base 1 bearing semiconductor devices. A contact hole 3 and a trench 4 for interconnects are formed in the insulating film 2 by the lithography/etching technique. Thereafter, a barrier layer 5 of TaN or the like is formed on the entire surface, and a seed layer 7 as an electric feed layer for electroplating is formed on the barrier layer 5.

Then, as shown in FIG. 32B, copper plating is carried out onto the surface of the substrate W to fill the contact hole 3 and the trench 4 with copper and, at the same time, deposit a copper film on the insulating film 2. Thereafter, the copper film 6 on the insulating film 2 is removed by chemical mechanical polishing (CMP) so as to make the surface of the copper film 6 filled in the contact hole 3 and the trench 4 for interconnects, and the surface of the insulating film 2 lie substantially on the same plane. An interconnect composed of the copper film 6, as shown in FIG. 32, is thus formed.

By the way, as shown in FIG. 33, when the copper film 6 is formed by plating on the surface of the substrate W in which a fine hole(s) 8 with a diameter $d_1$, e.g., on the order of 0.2 $\mu$m, and a large hole(s) 9 with a diameter $d_2$, e.g., on the order of 100 $\mu$m are present, the growth of plating is likely to be promoted at the portion above the fine hole 8, whereby the copper film 6 is raised at that portion, even when the effect of a plating liquid or an additive contained in the plating liquid is optimized. Further, the growth of plating with an adequately high levelling property cannot be made within the large hole 9. This results in a difference (a+b) in the level of the copper film 6 deposited on the substrate W, i.e. the height a of the raised portion above the fine hole 8 plus the depth b of the depressed portion above the large hole 9. Thus, in order to obtain the desired flat surface of substrate W with the fine hole 8 and the large hole 9 being fully filled with copper, it is necessary to provide the copper film 6 having a sufficiently large thickness beforehand, and remove by CMP the extra portion corresponding to the above difference (a+b) in the level.

This involves problems in that the large thickness of the plated film requires a prolonged time for processing by CMP in order to polish away the large amount. Increasing the rate of CMP processing to avoid the prolongation of processing time can cause dishing in the large hole.

In order to solve the above problems, it is required to make the thickness of the plated film as thin as possible, and prevent the formation of the raised and depressed portions in the plated film, despite the co-presence of fine and large holes in the surface of the substrate, thereby improving the flatness of the plated film. In this regard, when the plating treatment is carried out in an electrolytic copper sulfate bath, for example, it has not been possible to decrease both of the rise and the depression in the plated film merely by the action of the plating liquid or with an additive. It is possible to reduce the degree of rise in the plated film by temporarily using a reversed electric field as a power source, or by using a PR pulse power source during the film deposition process. This approach, however, cannot prevent the formation of depressed portions and, in addition, denatures the film at its surface portion.

Further, there is a strong demand for not resorting to CMP processing which, in general, needs a complicated operation and control, takes a considerably long processing time, and in addition, may be carried out, in general, in a separate apparatus from that of a plating treatment.

It is to be pointed out that though a low-K material, which has a low dielectric constant, is expected to be predominantly used in the future as a material for an insulating film, the low-K material has a low mechanical strength and therefore has difficulty enduring the stress applied during CMP processing. Thus, there is a demand for a method which enables the flattening of the substrate without giving stress thereto.

Further, a method has been reported which carries out CMP processing simultaneously with plating, viz. chemical mechanical electrolytic polishing. According to this method, the mechanical processing is carried out to promote the growing defect of plating, causing the problem of denaturing of the resulting film.

SUMMARY OF THE INVENTION

The present invention has been made in view of the above drawbacks in the prior art. It is therefore a first object of the present invention to provide a method and apparatus for forming interconnects which can obtain a plated film with improved flatness even when fine and large holes are co-present in the surface of a substrate, and which can carry out the subsequent CMP processing in a short time without suffering from dishing.

It is a second object of the present invention to provide a method and apparatus for forming interconnects which, while omitting a CMP treatment entirely or reducing a load upon a CMP treatment to the least possible extent, can successively carry out a series of copper interconnects-forming steps including a copper-filling step.

Further, it is a third object of the present invention to provide a polishing liquid which, when used in electrolytic polishing or chemical polishing, can polish a plated copper film formed on the surface of a substrate into a flatter film surface and can polish the surface of a substrate, in which copper and a conductive material other than copper are co-present, uniformly at the same polishing rate; and provide a polishing method which, due to the use of the above polishing liquid, can omit a CMP treatment entirely or can reduce the load from a CMP treatment to the least possible load.

In order to achieve the first object, the present invention provides a method for forming interconnects, comprising providing a substrate having fine recesses formed in a surface thereof plating the surface of the substrate in a plating liquid and electrolytic etching the plated film formed on the surface of the substrate in an etching liquid.

This method, when applied to a substrate having fine holes and large holes in the surface, promotes a bottom-up growth of plating in a large hole by carrying out plating in a plating liquid having a high levelling property, whereby it is possible to fill the large hole with a thinner plated film. Concomitantly with the bottom-up of plating in a large hole, the raised portion of plating above a fine hole becomes thicker. The raised portion can be selectively removed by the electrolytic etching. The above method can thus improve the flatness of a plated film.

In the present invention, the plating is carried out in a plating liquid for exclusive use in plating, and the etching in an etching liquid for exclusive use in etching, so as to prevent the plated film from deteriorating.

The etching liquid may preferably contain at least one additive selected from the group consisting of an additive which forms a complex compound or an organic complex with the metal of the plated film and an additive which can lower the corrosion potential of the metal of the plated film. The additive for forming the complex compound may specifically be pyrophosphoric acid or aminocarboxylic acid (e.g. glycine). The additive for forming the organic complex may be ethylenediamine, EDTA, DTPA, iminodiacetic acid, TETA, or NTA. When the plated film is a copper film, the additive which can lower the corrosion potential of copper includes thiourea and its derivatives.

A waveform of current flowing in the electrolytic etching may be, for example, a pulse waveform or a PR pulse waveform. Such waveforms can improve diffusion of the additive contained in the etching liquid.

The apparatus for forming interconnects of the present invention comprises a plating section for holding a plating liquid and plating a surface of a substrate having fine recesses formed in the surface thereof in the plating liquid and an etching section for holding an etching liquid and electrolytic etching the plated film formed on the surface of the substrate.

According to the apparatus, plating and electroetching can be carried out in a successive manner. Further, repeating the plating and electroetching treatments can further improve the flatness of the plated film.

The etching section may include, for example, a substrate holder for holding a substrate with its surface downward, a cathode plate immersed in the etching liquid and located facing the lower surface of the substrate held by the substrate holder, and a relative movement mechanism for allowing the substrate held by the substrate holder and the cathode plate to move relatively. The relative movement between the substrate and the cathode plate prevents a plated film from being locally etched excessively to worsen the flatness of the film.

The relative movement mechanism may comprise a substrate-rotating mechanism for rotating the substrate and a cathode plate-moving mechanism for rotating, reciprocating, eccentrically rotating the cathode plate, or making a scroll motion of the cathode plate.

This mechanism makes the velocities of the substrate at its various points relative to the cathode plate closer to one another so as to make the flow conditions of the etching liquid between the various points of the substrate and the cathode plate uniform, thereby avoiding the generation of a singular point in the flow of etching liquid. The distance between the cathode plate and the substrate (anode) should preferably be made as small as possible mechanically, and is preferably 1.0 mm or less, more preferably 0.5 mm or less.

According to a preferred aspect of the present invention, the apparatus further comprises a plurality of grooves extending over the full length of the cathode plate in the surface thereof, and a plurality of etching liquid feed holes formed in the cathode plate for feeding the etching liquid to the grooves, the plurality of etching liquid feed holes communicating with the grooves.

During the electroetching, the etching liquid is fed from the grooves formed in the surface of the cathode plate to between the two electrodes, i.e. the cathode plate and the substrate, while particles floating in the etching liquid is allowed to pass through the grooves to the outside by the action of centrifugal force. This makes it possible that a fresh etching liquid is always present between the electrodes. The grooves may preferably be formed in parallel or in a lattice arrangement so as not to make a difference in current density between the center and the periphery of the cathode plate and, in addition, to allow the etching liquid to flow smoothly to the outside.

The substrate holder may be constructed to hold the substrate in a vacuum attraction manner or in an electrostatic chucking manner. Such a substrate holder can hold the substrate by attracting the entire surface of the substrate, thereby absorbing undulations present in the substrate, so that the substrate holder can be held with a flattened state.

The cathode plate may be composed of a material having a poor adhesion to copper. When the electroetching is carried out, for example, to a plated copper film by using a cathode plate made of e.g. titanium whose oxide shows poor adhesion to copper, the dissolved copper ions are precipitated onto the cathode plate side but the precipitate is immediately released from the cathode plate to float as copper particles in the etching liquid. The etching liquid containing the floating copper particles is allowed to flow to the outside. The etching can thus be carried out without suffering from the deterioration with time of the surface flatness of the cathode plate. Further, the generation of hydrogen gas during the etching can be prevented. The etching can thus provide the etched surface with excellent flatness.

In order to achieve the second object, the present invention provides an apparatus for forming interconnects by forming a copper film on a surface of a substrate to fill copper into fine recesses formed in the surface of the substrate, comprising a housing, a transport route provided in the housing for transporting the substrate, and a copper-plating section, an electrolytic or chemical polishing section, and an annealing section which are disposed along the transport route.

According to this apparatus, the flattening process after copper plating is carried out mainly by means of electrolytic or chemical polishing. Thus, the apparatus can omit a CMP treatment entirely or reduce a load upon a CMP treatment, and can successively carry out a series of flattening steps including annealing in the same housing.

A cleaning section may be provided in the housing for cleaning the substrate.

At least two of the electrolytic or chemical polishing sections may be provided for carrying out a first-stage electrolytic or chemical polishing and a second-stage electrolytic or chemical polishing. This enables such two-stage electrolytic or chemical polishing treatment to the surface of copper that the rate of polishing or the polishing selectivity to the base is made different between the first and the second stages so as to obtain a flatter copper surface, or that the surface of copper is polished in the first stage, and in the second stage, the exposed copper and other conductive materials (e.g. TaN) are polished evenly at the same polishing rate.

The apparatus may be provided a cap-plating treatment section for forming a protective film which selectively covers and protects the exposed surface of copper interconnects. The cap-plating treatment for protecting the exposed surface of copper interconnects by the selective coating of a protective film thereon can thus be carried out successively in the same housing.

The present invention provides a method for forming interconnects by forming a copper film on a surface of a substrate to fill copper into fine recesses formed in the surface of the substrate, comprising plating the substrate with copper to form the copper film on the surface and to fill copper into the fine recesses of the substrate, electrolytic or chemical polishing the surface of the substrate having the copper film thereon in a polishing liquid and annealing the substrate in such a state that the copper film remains on the entire surface of the substrate, after the polishing.

After the annealing treatment, the substrate may be subjected to a CMP treatment, and the treated substrate may then be subjected to the above described cap-plating treatment to selectively cover the exposed surface of copper interconnects with a protective film. The above manner of first carrying out the wet treatments, followed by the dry treatments, has the merit that the wet treatment sections and the dry treatment sections can be arranged in separate divisions in an apparatus. It is however possible to follow the sequence of plating→annealing→electrolytic or chemical polishing→CMP.

The present invention further provides a method for forming interconnects by forming a copper film on a surface of a substrate to fill copper into fine recesses formed in the surface of the substrate, comprising plating the substrate with copper to form the copper film on the surface and to fill copper into the fine recesses of the substrate, annealing the substrate having the copper film thereon and electrolytic or chemical polishing the surface of the substrate in a polishing liquid after the annealing. This method can omit a CMP treatment entirely.

The substrate may have a cap-plating treatment applied there to to selectively cover the exposed surface of the copper interconnects with a protective film after the polishing.

In order to achieve the third object, the present invention provides a polishing liquid for use in electrolytic or chemical polishing of copper by immersing therein a substrate having fine recesses in a surface thereof which are filled with copper by forming copper film, comprising at least one inorganic acid and/or an organic acid capable of dissolving copper and at least one viscosity-increasing agent selected from the group consisting of polyhydric alcohols, high-molecular weight polyhydric alcohols and alkylene glycol alkyl or aryl ethers.

The polishing liquid, when used in the electrolytic or chemical polishing of the surface of a copper film formed on a substrate, can enlarge the diffusion layer on the substrate in which a copper complex is present, and therefore can raise the polarization potential and suppress the conductivity of the entire surface of the substrate in the liquid, thereby suppressing the dissolution of copper over the entire substrate surface and/or the movement of copper ions in the liquid and making the surface not sensitive to a minute change in current density, whereby the polished surface endured with high-flatness can be obtained. In this connection, it has been found that the enlargement of the diffusion layer, the rise in polarization potential and the suppression of conductivity depend largely on the viscosity of the polishing liquid used.

Examples of the polyhydric alcohols include ethylene glycol, propylene glycol and glycerin. Examples of the high-molecular weight polyhydric alcohols include polyethylene glycol and polypropylene glycol. Examples of the alkylene glycol alkyl or aryl ethers include ethylene glycol ethyl ether, ethylene glycol methyl ether, ethylene glycol propyl ether, ethylene glycol phenyl ether, propylene glycol ethyl ether, propylene glycol phenyl ether and dipropylene glycol monomethyl ether.

The polishing liquid preferably has a viscosity of 10 cP (0.1 Pa·s) or more and a conductivity of 20 mS/cm or lower.

It is preferred that the polishing liquid further contains an additive which can adhere to the surface of copper and electrically and/or chemically suppress the dissolution of copper. The use of the polishing liquid containing such an additive in the electrolytic or chemical polishing can provide the polished copper surface with improved flatness. Further, when copper and other conductive materials (such as TaN) are exposed on the surface of a substrate, the electrolytic or chemical polishing of the substrate with the use of the additive-containing polishing liquid can polish the copper and the other conductive material (such as TaN) evenly at the same polishing rate. Specific examples of the additive may include imidazole, benzimidazole, benzotriazole and phenacetin.

The polishing liquid may preferably contain a basic liquid or an additive which forms a strong complex with copper or promotes the formation of a passivated film on the surface of copper. The use of the polishing liquid containing such a basic liquid or an additive can provide the polished copper surface with improved flatness.

Further, when copper and other conductive materials (such as TaN) are exposed on the surface of a substrate, the electrolytic or chemical polishing of the substrate with the use of such polishing liquid can polish the copper and the other materials (such as TaN) evenly at the same polishing rate. Chromic acid may be mentioned as an example of the basic liquid for promoting the formation of a passivated film on the surface of copper. EDTA and quinaldin may be mentioned as examples of the additive, and pyrophosphoric acid as an example of the basic liquid, for forming a complex with copper.

The present invention provides a method for polishing a substrate having fine recesses in a surface thereof which are filled with copper by forming copper film, comprising electrolytic or chemical polishing the surface of the substrate, where only copper is exposed thereon, in a polishing liquid in which the dissolution of copper is suppressed and electrolytic or chemical polishing the surface of the substrate, where only copper is exposed, or copper and a conductive material other than copper are exposed, in a polishing liquid in which the dissolution of copper is further suppressed.

According to this method, the unnecessary portion of plated copper film can be remove by the electrolytic polishing into a flat surface, and the flatness can be improved by the subsequent electrolytic or chemical polishing. Alternatively, the first electrolytic polishing to remove the unnecessary copper is allowed to proceed until a conductive material other than copper (such as TaN) becomes exposed on the surface, and the exposed material (such as TaN), together with the exposed copper, can then be polished away at the same rate by the second electrolytic or chemical polishing into a flatter surface. The polishing method of the present invention can thus omit a CMP treatment entirely, or reduce a load upon a CMP treatment to the least possible extent.

Copper remaining on the surface of the other conductive material is removed by electrolytic or chemical polishing. The removal of such copper can avoid a rise in polishing rate of copper, which would be caused if the copper would remain unremoved, in the subsequent electrolytic or chemical polishing.

The other conductive material, not having been removed, may be removed. After the electrolytic or chemical polishing, the other conductive material, not having been removed by the polishing and remaining on the insulating film, e.g. a $SiO_2$ oxide film or a film of low-K material, may be removed without resorting to a CMP processing.

The copper and/or the other conductive material remaining on the surface of the substrate may be removed either by passivating only the surface of the copper and preferentially electrolytic or chemical polishing the other conductive material, or by passivating the entire surface including the copper and the other conductive material, and composite electrolytic polishing said entire surface.

The above and other objects, features, and advantages of the present invention will be apparent from the following description when taken in conjunction with the accompanying drawings which illustrates preferred embodiments of the present invention by way of example.

BRIEF DESCRIPTION OF THE DRAWINGS

FIG. 3 is a schematic view of an etching section used in the apparatus of FIG. 1;

FIG. 4 is a schematic view of another embodiment of an etching section;

FIG. 10 is a conceptual cross-sectional view showing the state of a substrate after the etching treatment;

FIG. 13 is a diagram showing an example of a current pulse to be applied in the etching section of FIG. 11;

DETAILED DESCRIPTION OF THE PREFERRED EMBODIMENTS

Preferred embodiments of the present invention will now be described with reference to the drawings.

Figure 1:
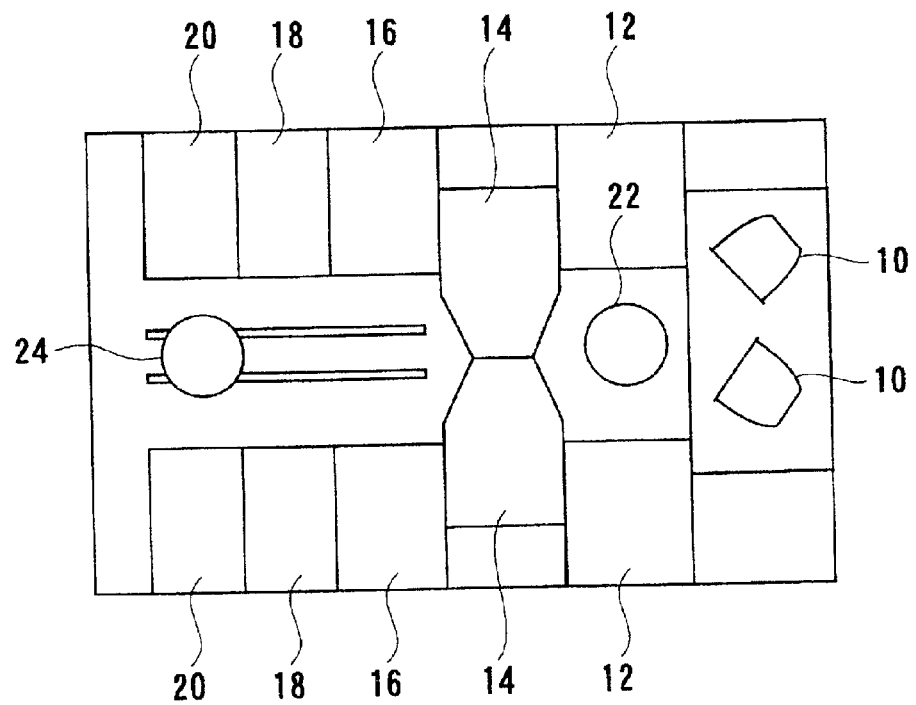
FIG. 1 is a plan view of an embodiment of an interconnects-forming apparatus in accordance with the present invention.

FIG. 1 is a plan view of an interconnects-forming apparatus in accordance with the present invention. The interconnects-forming apparatus comprises pairs of loading/unloading sections 10, cleaning/drying sections 12, temporary storage sections 14, plating sections 16, washing sections 18 and etching sections 20. The apparatus is also provided with a first transport mechanism 22 for transporting a substrate between the loading/unloading sections 10, the cleaning/drying sections 12 and the temporary storage sections 14, and a second transport mechanism 24 for transporting a substrate between the temporary storage sections 14, the plating sections 16, the washing sections 18 and the etching sections 20.

Figure 2:
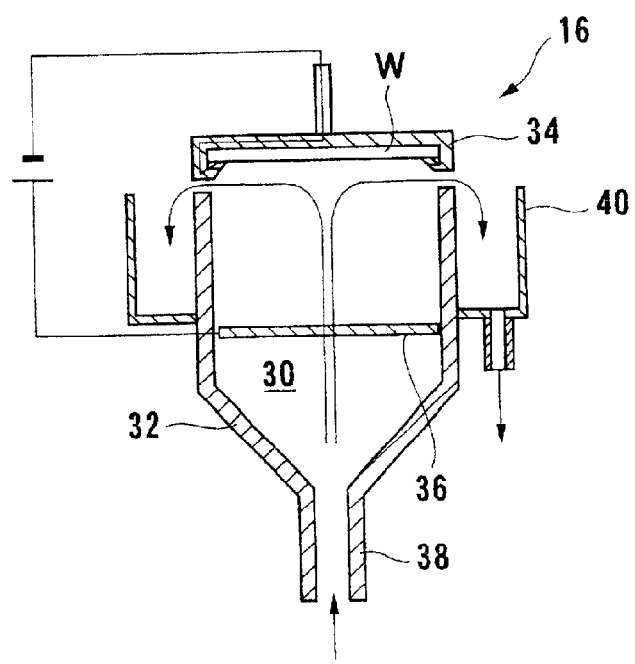
FIG. 2 is a schematic view of a plating section used in the apparatus of FIG.1.

As shown in FIG. 2, the plating section 16 includes a top-opened cylindrical plating tank 32 for accommodating a plating liquid 30, and a substrate holder 34 for detachably holding a substrate W with its front surface downward at such a position that the substrate W covers the top opening of the plating tank 32. In the inside of the plating tank 32, an anode plate 36 in a flat plate shape, which makes an anode electrode when immersed in the plating liquid 30 with the substrate as a cathode, is disposed horizontally. The center portion of the bottom of the plating tank 32 is connected to a plating liquid injection pipe 38 for spurting a plating liquid upwardly to form a jet flow. Further, a plating liquid receiver 40 is provided around the upper outer periphery of the plating tank 32.

In operation, a substrate W held with its front surface downward by the substrate holder 34 is positioned above the plating tank 32 and a given voltage is applied between the anode plate 36 (anode) and the substrate W (cathode) while the plating liquid 30 is allowed to spurt upwardly from the plating liquid injection pipe 38 so that the jet flow of the plating liquid 30 hits vertically against the lower surface (to be plated surface) of the substrate W, whereby a plating current is allowed to pass between the anode plate 36 and the substrate W, and a plated film is thus formed on the lower surface of the substrate W.

As shown in FIG. 3, the etching section 20 includes a top-opened cylindrical etching tank 52 for accommodating an etching liquid 50, and a substrate holder 56 for detachably holding the substrate W with its front surface downward by a holding member 54, such as an electrostatic chuck, at such a position that the substrate W covers the top opening of the etching tank 52. In the inside of the etching tank 52, a cathode plate 58 in a flat plate shape, which makes a cathode. electrode when immersed in the etching liquid 50 with the substrate as an anode, is disposed horizontally. The substrate holder 56, at its center, is connected to the lower end of a drive shaft 62 that is connected to a motor 62, so that it is allowed to rotate together with the substrate W. The cathode plate 58 is connected to one end of a reciprocating rod 66 which is driven by an actuator 64 such as a cylinder, so that it is allowed to reciprocate horizontally by the actuation of the actuator 64.

In operation, while the lower surface (to be etched surface) of the substrate W, which is held with its front surface downward by the substrate holder 56, is kept in contact with the etching liquid 50, the substrate W is allowed to rotate together with the substrate holder 56 and, at the same time, the cathode plate 58 is allowed to reciprocate, while a given voltage is applied between the cathode plate 58 (cathode) and the substrate W (anode) to pass an electric current therebetween so as to electrolyticaly etch a plated film on the substrate W.

FIG. 4 shows another embodiment of an etching section which employs a cathode plate 58 having a larger diameter than that of the substrate W. The cathode plate 58 is connected at its center to the upper end of a drive shaft 70 that is connected to a motor 68, so that it is allowed to rotate by the actuation of the motor 68.

An interconnects-forming process will now be described by referring to FIGS. 5 through 10.

Figure 32A:
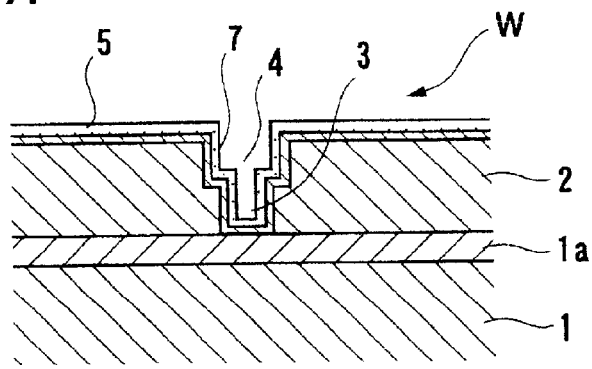
FIGS. 32A through 32C are diagrams illustrating, in a sequence of process steps, the formation of copper interconnects through copper plating.

First, the substrate W, which has in the surface a fine hole(s) 8 and a large hole(s) 9 for interconnects (see FIG. 7) and has a seed layer 7 (see FIG. 32A) as an uppermost layer, is taken out one by one from the loading/unloading section 10 by the first transport mechanism 22, and is transported, via the temporary storage section 14, to the plating section 16 (step 1).

Figure 6A:
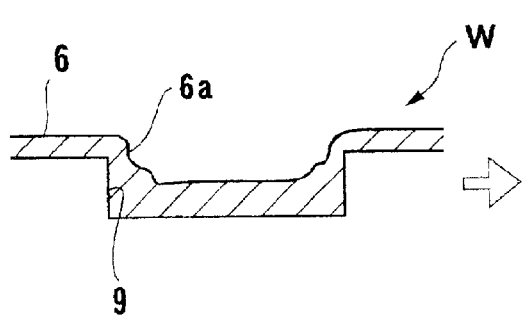
FIGS. 6A and 6B are conceptual cross-sectional views illustrating the progress of plating on a substrate.
Figure 6B:
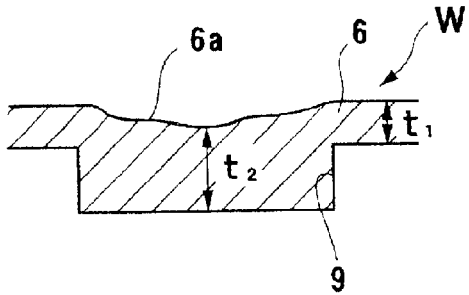
Figure 7:
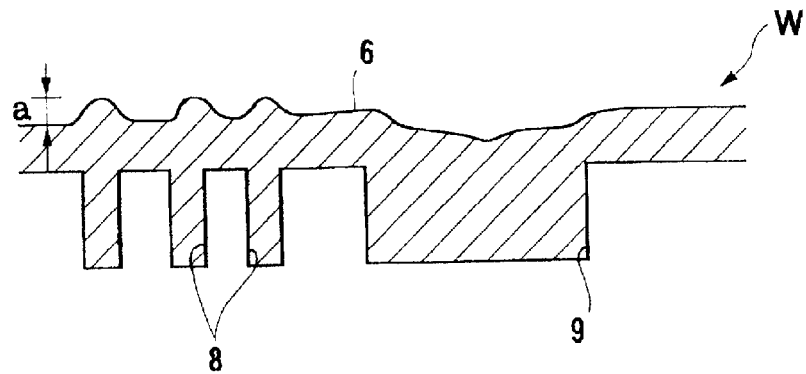
FIG. 7 is a conceptual cross-sectional view showing the state of a plated substrate.

Next, plating is carried out onto the substrate W in the plating section 16, thereby forming a plated copper film 6 on the surface of the substrate W as shown in FIGS. 6A, 6B and 7 (step 2). In carrying out the plating, with a primary view to reducing a depression 6a in the plated copper film 6 caused by the presence of the large hole 9, there is used, as the plating liquid 30 shown in FIG. 2, a plating liquid having a high levelling property, for example a liquid of a high levelling composition with a high copper sulfate concentration and a low sulfuric acid concentration, e.g. a composition of 100–300 g/l of copper sulfate and 10–100 g/l of sulfuric acid. An additive for improving the levelling property, e.g. polyalkylene imine, a quaternary ammonium salt and a cationic dye, may be added to the plating liquid. By the term "levelling property" is herein meant a property of inducing a bottom-up growth of plating in the hole.

The use of such a high-levelling plating liquid 30 in the plating onto the substrate W promotes the bottom-up growth of plating in the large hole 9 and, as a result, as shown in FIGS. 6A and 6B, the thickness $t_2$ of the plated copper film 6 in the large hole 9 becomes larger than the thickness $t_1$ of the plated copper film 6 on the plane surface portion. This means that the large hole 9 can be filled with copper with the small thickness $t_1$ of plated film. On the other hand, as shown in FIG. 7, the use of the high-levelling polishing liquid increases the height a of the raised portion of the copper film 6 above the fine hole 8.

After the completion of plating, the plated substrate W is, according to necessity, transported to the washing section 18 for washing by water (step 3), and the substrate is then transported to the etching section 20.

Next, the surface (plated surface) of the substrate W is subjected to electrolytic etching in the etching section 20 to effect etching of the copper film 6 formed on the substrate W (step 4). In carrying out the etching, there is used, as the etching liquid 50 shown in FIGS. 3 and 4, an etching liquid containing an additive which can form with copper a complex compound or an organic complex, including an additive which acts as an etching-promoting agent, such as pyrophosphoric acid, ethylenediamine, aminocarboxylic acid, EDTA, DTPA, iminodiacetic acid, TETA, NTA, and their derivatives, or an additive which acts as an etching-suppressing agent, such as a quaternary ammonium salt and a polymer, or an additive which can lower the corrosion potential of copper, such as thiourea or its derivatives. As the base bath, acids such as sulfuric acid, hydrochloric acid, sulfuric peroxide mixture, and hydrofluoric peroxide mixture, and alkalis such as ammonium peroxide mixture may be used, though use is not limited thereto.

Figure 8A:
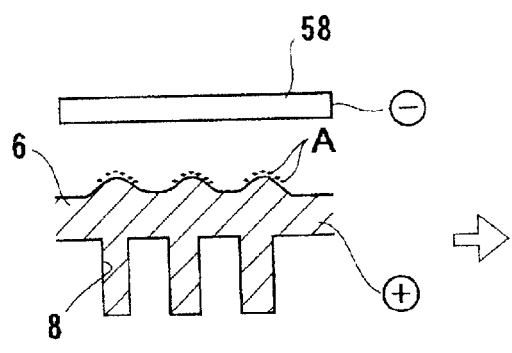
FIGS. 8A and 8B are conceptual cross-sectional views illustrating an example of selective etching in an etching section.
Figure 8B:
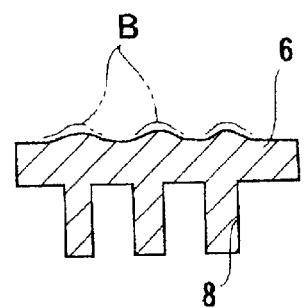
Figure 9A:
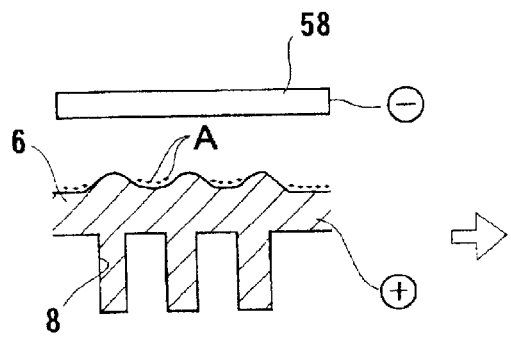
FIGS. 9A and 9B are conceptual cross-sectional views illustrating another example of selective etching in an etching section.
Figure 9B:
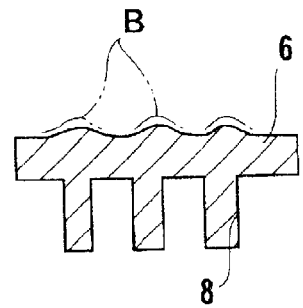

When etching is carried out by using, as the etching liquid, an etching liquid containing the additive which preferentially adheres to a high-current density site in the copper film and acts to lower the potential at that site or the additive which can form with copper a complex compound or an organic complex, and by providing an electric field between the substrate W as the anode and the cathode plate 58 (cathode) that are disposed opposite to each other as shown in FIGS. 3 and 4, the additive A adheres selectively to the raised portions of high current density as shown in FIG. 8A and the additive A lowers the potentials at the raised portions, whereby etching portions B, indicated by the image lines in FIG. 8A, are etched away. Selective etching of the raised portions in the copper film 6 is thus effected. On the other hand, when etching is carried out in the same manner but using an etching liquid containing the additive which preferentially adheres to a low-current density site and acts to suppress etching, the additive A adheres selectively to the valley portions as shown in FIG. 9A and suppresses etching at the valley portions, whereby etching portion B, indicated by the image line in FIG. 9B, are etched away. Selective etching of the raised portions is thus effected.

The selective etching of the raised portions in the copper film 6 can thus decrease the level difference L between the top of the raised portion and the bottom of the depressed portion as shown in FIG. 10, providing the copper film with improved flatness. When such a flattened substrate is subjected to a CMP processing, the processing can be carried out at a relatively low CMP rate, and therefore without suffering from dishing, in a short time.

The waveform pulse of the electric current applied in the above electroetching may be a pulse waveform or a PR pulse waveform. The use of such a waveform pulse can improve the diffusion of the additive contained in the etching liquid. As the case may be, the etching liquid may be composed solely of the base bath, i.e. not containing any additive.

During the etching process, in the case of the etching section 20 shown in FIG. 3, the substrate W is allowed to rotate while the cathode plate 58 is allowed to reciprocate. In the case of the etching section 20 shown in FIG. 4, the substrate W and the cathode plate 58 are both allowed to rotate in the same direction. In either case, the substrate W and the cathode plate 58 are thus made to move relatively so as to make the velocities of the substrate W at its various points relative to the cathode plate 58 closer to one another, thereby making the flow conditions of the etching liquid between the various paints of the substrate W and the cathode plate 58 uniform so as not to make a singular point in the flow of etching liquid. This can prevent the plated film on the substrate W from being locally etched excessively to worsen the flatness of the substrate surface.

After the completion of the etching treatment, the substrate W is, according to necessity, transported to the washing section 18 for washing by water (step 5), and the substrate W is then transported to the cleaning/drying section 12 for cleaning and drying of the substrate W (step 6). Thereafter, the substrate is returned to a cassette in the loading/unloading section 10 by the first transport mechanism 22 (step 7).

Figure 5:
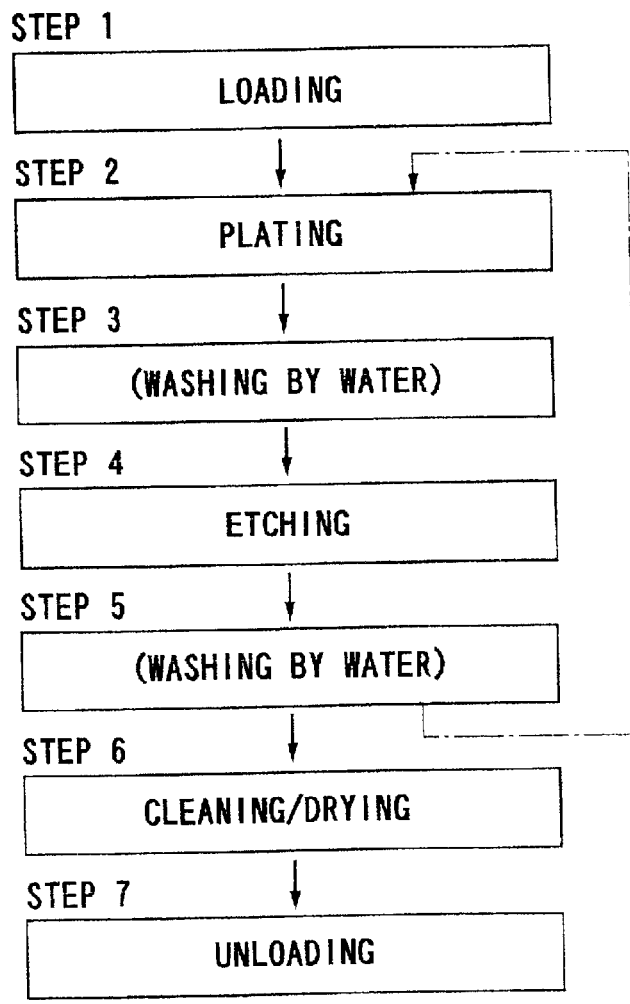
FIG. 5 is a flow diagram showing the flow of process steps in the interconnects-forming apparatus of FIG. 1.

The above plating and etching steps can be carried out repeatedly, as shown by the image line in FIG. 5. Repetition of the respective plating followed by the selective etching of the raised portions in the plated copper film, can further improve the flatness of the copper film. Though the plating treatment and the etching treatment are carried out successively in the same apparatus according to the embodiment of FIG. 1, the treatments may be carried out independently in separate apparatuses.

In order to make the plated surface of the substrate as flat as possible by the electrolytic etching, it is important to hold the substrate with its best flattened state and use a cathode plate (cathode) having the flattest possible finish, and also to allow them to move relatively while they are kept as close as possible so as not to make, within the area of the substrate surface, any singular points in the flow of etching liquid and in the electric field.

Figure 11:
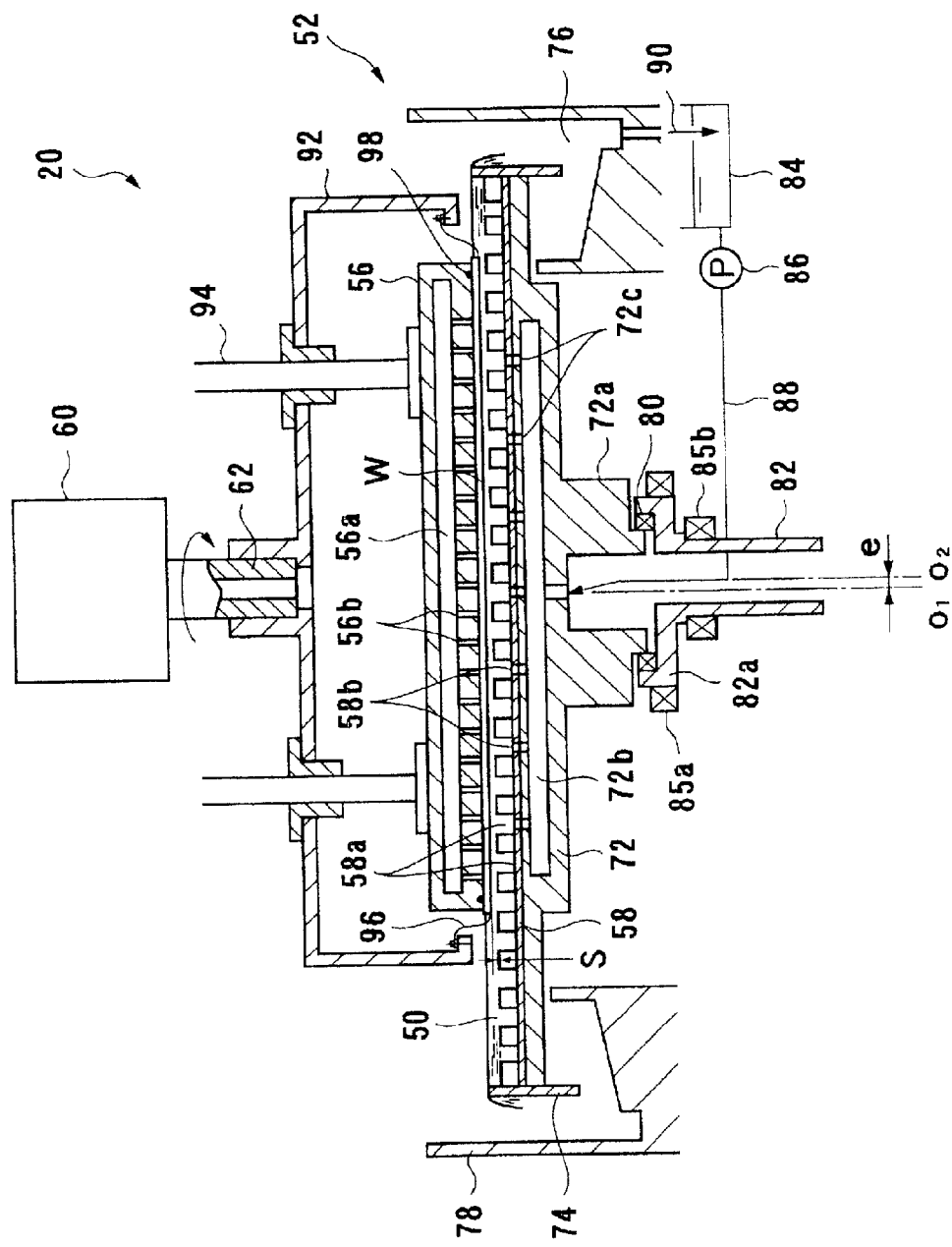
FIG. 11 is a cross-sectional view of yet another embodiment of an etching section.
Figure 12:
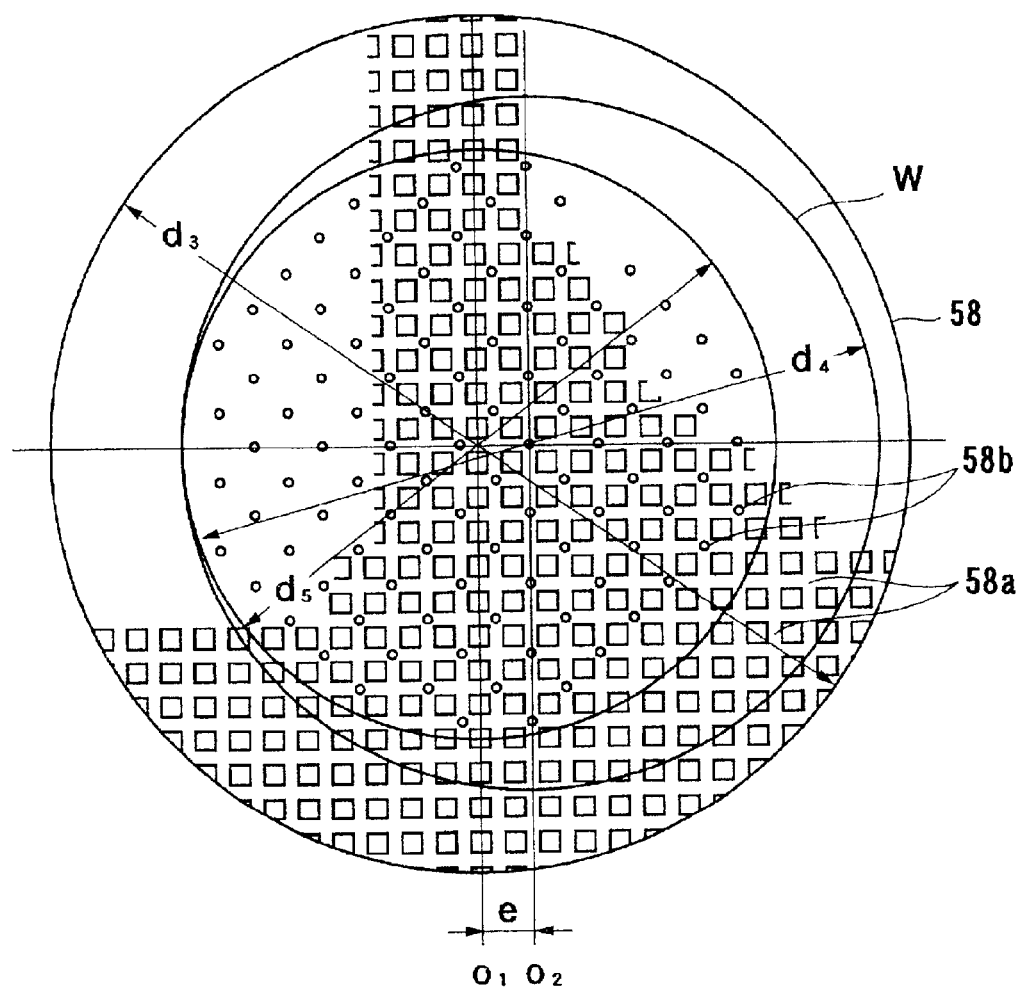
FIG. 12 is a plan view of a cathode plate used in the etching section of FIG. 11.

FIGS. 11 and 12 show yet another embodiment of an etching section 20 which meets the above demands. The etching section 20 includes a top-opened cylindrical etching tank 52 for accommodating an etching liquid 50, and a substrate holder 56 for detachably holding a substrate W with its front surface downward at such a position that the substrate W covers the top opening of the etching tank 52.

The etching tank 52 comprises a substantially discoidal bottom plate 72, a cylindrical overflow weir 74 fixed to the peripheral end of the bottom plate 72, and an outer shell 78 surrounding the outer periphery of the overflow weir 74 and defining an etching liquid drainage zone 76 between itself and the overflow weir 74. A cathode plate 58 in a plain plate shape, which makes a cathode when immersed in the etching liquid 50, is disposed horizontally on the upper surface of the bottom plate 72 of the etching tank 52.

A cylindrical boss 72a is provided integrally to the central portion of the lower surface of the bottom plate 72 of the etching tank 52, and the boss 72a is rotatably mounted, through a bearing 80, on a crank portion 82a located at the upper end of a rotating shaft 82. Thus, the central axis $O_1$ of the crank portion 82a is eccentric to the central axis $O_2$ of the rotating shaft 82 with an eccentricity e, whereas the central axis $O_1$ of the crank portion 82a coincides with the central axis of the boss 72a. The rotating shaft 82 is rotatably mounted, through bearings 85a and 85b, on the outer shell 78. Though not shown in FIGS. 11 and 12, rotation-prevention mechanisms for preventing rotation of the bottom plate 72 about its own axis are provided between the bottom plate 72 and the outer shell 78.

When the rotating shaft 82 is rotated, the crank portion 82a is allowed to make a revolutionary movement with the eccentricity e as a radius, and the revolutionary movement of the crank portion 82a causes the bottom plate 72 to make, together with the cathode plate 58, a scroll movement (translational rotation) with the eccentricity e as radius, i.e., a revolutionary movement with the eccentricity e as a radius, with rotation about its own axis being inhibited.

As shown in FIG. 12, the diameter $d_3$ of the cathode plate 58 is determined so that even when the substrate W of diameter $d_4$ makes a scroll movement, the substrate W does not move out of the area of the cathode plate 58. The diameter $d_5$ of the etching liquid feed zone, which contains the below-described etching liquid feed holes 58b, is determined so that even when the substrate W of diameter $d_5$ makes a scroll movement, the etching liquid feed zone remains within the area of the substrate W.

The bottom plate 72 is provided, on its inside, with a etching liquid chamber 72b communicated with an etching liquid feed line 88 extending from a circulation tank 84 and including midway a pressure pump 86, and a plurality of etching liquid discharge holes 72c extending upwardly from the etching liquid chamber 72b. The circulation tank 84 communicates with the etching liquid drainage zone 76 through a return line 90.

When the cathode plated 58 is used in the electrolytic etching of a plated copper film, it is made of such material as titanium that forms an oxide thereof on the surface of the plate, whose oxide has a poor adhesion to copper. When the electroetching is carried out onto a plated copper film by using such a cathode plate, the dissolved copper ions are precipitated onto the cathode plate 58 (cathode) side, but the precipitate is immediately released from the cathode plate 58 due to the poor adhesion between copper and the cathode plate 58, and the released precipitate comes to float as copper particles in the etching liquid. Further, the generation of hydrogen gas during the etching process can be prevented. The electrolytic etching can thus provide the etched surface with excellent flatness.

In the surface of the cathode plate 58, there are formed a number of grooves 58a extending linearly over the full length of the cathode plate 58 in a lattice form, and in the inside of the cathode plate 58, a plurality of etching liquid feed holes 58b, each disposed to correspond to each etching liquid discharge hole 72c and communicated with the groove 58a, are provided.

During the electroetching, the etching liquid 50 is fed from the grooves 58a formed in the surface of the cathode plate 58 to between the two electrodes, i.e. the cathode plate 58 and the substrate W, while particles floating in the etching liquid 50 is allowed to pass through the grooves 58a to the outside smoothly by the action of centrifugal force. This makes it possible that a fresh etching liquid 50 is always present between the electrodes. Further, selection for the cathode plate 58 of such material as titanium, whose oxide formed on the surface exhibits poor adhesion to copper, in carrying out the electroetching of a plated copper film makes it possible that the copper, once precipitated onto the cathode plate side from its dissolved ion state, is immediately released from the cathode plate 58 to float as copper particles in the etching liquid. The etching liquid containing such copper particles is allowed to pass through the grooves 58a and flow smoothly to the outside. This prevents the deterioration with time of the surface flatness of the cathode plate 58, thus ensuring the flatness of the cathode plate 58.

In order to prevent making a difference in current density between the center and the periphery of the cathode plate 58 and also to allow the etching liquid 50 to flow smoothly through the grooves 58a, the grooves 58a are preferably formed in a lattice arrangement when the substrate W makes a scroll movement. When the substrate W makes a reciprocating movement, the grooves 58a are preferably arranged in parallel in the movement direction.

The substrate holder 56 is housed in an under-opened housing 92, and is designed to be capable of moving up and down by a lifting rod 94, and rotating together with the housing 92 through a motor 60. The substrate holder 56, on its inside, is provided with a vacuum chamber 56a that communicates with a vacuum source, and a number of vacuum attraction holes 56b penetrating downwardly from the vacuum chamber 56a. The substrate holder 56 is thus constructed to hold the substrate W in a vacuum attraction manner.

Usually, small undulations are present on the substrate W. Further, the substrate can further deform depending on how it is held. With such a deformed substrate, it is generally not possible to flatten with 0.1 $\mu$m or less of irregularity. According the vacuum attraction method herein employed, the substrate W is held with its entire surface being kept attracted, whereby the undulations present on the substrate can be absorbed and thus the substrate can be held with a flatter state. Accordingly, it becomes possible to obtain flatness of less than 0.1 $\mu$m irregularity by the electroetching treatment.

An electrostatic chucking manner for holding the substrate may be adopted instead of the vacuum attraction manner.

When the substrate W held by the substrate holder 56 is lowered down to a position for etching treatment, the distance S between the lower surface of the substrate W and the upper surface of the cathode plate 58 should be made as small as possible mechanically, preferably is 1.0 mm or less, and more preferably 0.5 mm or less. By thus making the anode-cathode distance S as small as possible mechanically, i.e., preferably 1.0 mm or less and more preferably 0.5 mm or less, the concentration of electric current on the raised portions on the surface of the substrate W, which are to be preferentially etched, is promoted, and a vertical electric field can be formed between the substrate W and the cathode plate 58, whereby the entire surface (plated surface) of the substrate W can be successfully etched into an evenly flattened surface.

In the housing 92, electric contacts 96 are provided which, when the substrate W is attracted and held by the substrate W, contact with the bevel portion or the peripheral portion of the substrate W to make the substrate anode. Further, a packing 98 is provided on the lower surface of the substrate holder 56 which, when the substrate W is held by the holder, makes a pressure contact with the upper surface of the substrate for sealing.

Operations for carrying out electroplating in the above etching section 20 will now be described.

First, the etching liquid 50 is fed into the etching tank 52 and, while the etching liquid 50 is overflowing from the overflow weir 74, the bottom plate 72 is allowed to make, together with the cathode plate 58, a scroll movement. Under these conditions, as described above, the substrate holder 56 holding the substrate W with its plated (e.g. copper-plated) surface downward is lowered, while rotating the substrate W, down to a position for electroetching.

The relative movement between the substrate W and cathode plate 58 makes the velocities of the substrate W at its various points relative to the cathode plate 58 closer to one another so as to make the flow conditions of the etching liquid 50 between the various points of the substrate W and the cathode plate 58 uniform, that is to say, so as not make a singular point in the flow of etching liquid.

Under the above conditions, a pulse current as shown in FIG. 13, for example, with a time $t_1$ to be applied of 1 $\mu$m–10 $\mu$m, preferably 10 $\mu$m, and with a current density to be applied of 5–50 A/dm$^2$, is applied a plurality of times with stoppage times $t_2$, each time $t_2$ larger e.g. by about 5–20 times the time $t_1$ being interposed. Upon passing of current, oxidation dissolution of the plated film occurs first at the raised portion of the substrate, and then shifts to the plane portion. Accordingly, passing of current and immediate shutoff of the power feed, when repeated, enables selective etching of the raised portion.

The etching liquid 50 is fed from the grooves 58a formed in the surface of the cathode plate 58 to between the two electrodes, i.e. the cathode plate 58 and the substrate W, while particles floating in the etching liquid is allowed to pass through the grooves 58a to the outside smoothly by the action of centrifugal force, whereby a fresh etching liquid 50 is always present between the electrodes. Selection for the cathode plate 58 of such material as titanium, whose oxide formed on the surface exhibits poor adhesion to copper, in carrying out the electroetching of a plated copper film makes it possible that the copper, once precipitated onto the cathode plate side from its dissolved ion state, is immediately released from the cathode plate 58 to float as copper particles in the etching liquid. The etching liquid containing such copper particles is allowed to pass through the grooves 58a and flow smoothly to the outside. This prevents the deterioration with time of the surface flatness of the cathode plate 58, thus ensuring the flatness of the cathode plate 58. Moreover, since the anode-cathode distance S can thus be kept constant during the operation and the generation of hydrogen gas can be prevented, the electroetching can provide the etched surface with excellent flatness.

As described above, the substrate W after the etching treatment is, according to necessity, transported to the washing section 18 (see FIG. 1) for washing by water, followed by the same procedure as described above.

According to the above described embodiment, a substrate having fine holes and large holes in the surface is first subjected to the plating carried out in the plating liquid having a high levelling property so as to promote the bottom-up growth of plating in the large holes, and the substrate is then subjected to the electrolytic etching (electroetching) to selectively remove the raised portions in the plated film, whereby the flatness of the plated film can be improved. This enables a later CMP processing to be carried out, without suffering from dishing, in a short time.

Figure 14:
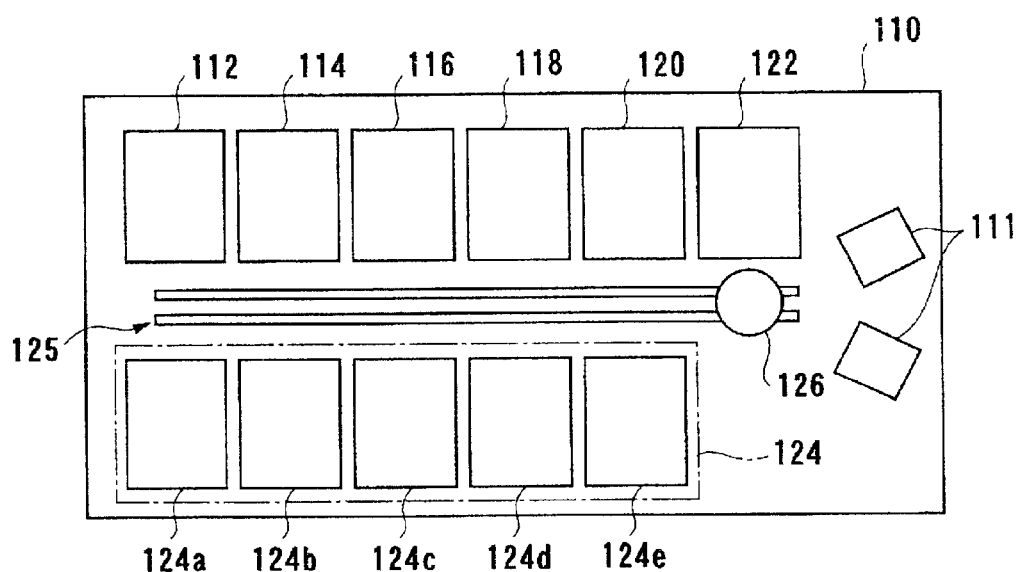
FIG. 14 is a plan view-of another embodiment of an interconnects-forming apparatus in accordance with the present invention.

FIG. 14 is a plan view showing another embodiment of an interconnects-forming apparatus in accordance with the present invention. The interconnects-forming apparatus comprises a housing 110 that houses the following: loading/unloading sections 111; a transport route 125; a copper-plating section 112, a cleaning/drying section 114, an annealing section 116, a first electrolytic or chemical polishing section 118, a second electrolytic or chemical polishing section 120 and a cleaning/drying section 122, which are arranged in the above order along the transport route 125 on one side thereof; and a cap-plating treatment section 124 including a pretreatment section 124a, a Pd-attaching treatment section 124b, a pre-plating treatment section 124c, an electroless CoWP-plating section 124d and a cleaning/drying section 124e, which are arranged along the transport route 125 on the other side thereof. Further, the apparatus is provided with a transporting device 126 movable along the transport route 125 for transporting a substrate between the above sections.

Figure 15:
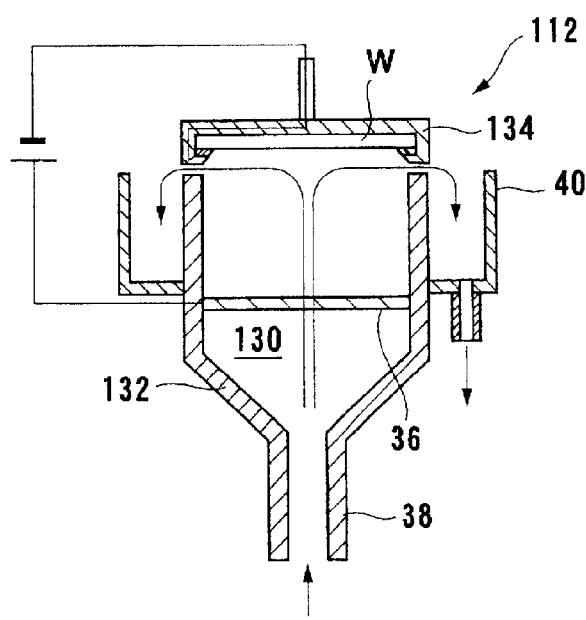
FIG. 15 is a schematic view of a copper-plating section used in the apparatus of FIG. 14.

As shown in FIG. 15, the plating section 112 includes a top-opened cylindrical plating tank 132 for accommodating a plating liquid 130, and a substrate holder 134 for detachably holding a substrate W with its front surface downward at such a position that the substrate covers the top opening of the plating tank 132. The other construction of the plating section 112 is the same as the plating section 16 shown in FIG. 2, and hence a description thereof is herein omitted, with the same reference numerals being given to the same members.

Figure 16:
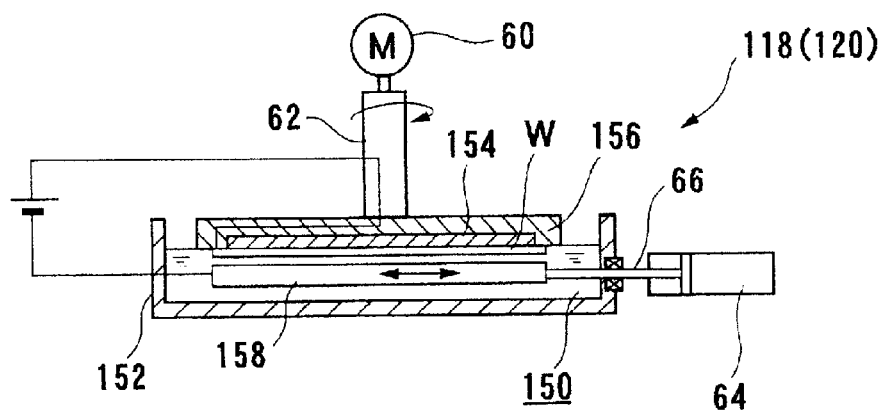
FIG. 16 is a schematic view of an electrolytic or chemical polishing section used in the apparatus of FIG. 14.

As shown in FIG. 16, the electrolytic or chemical polishing sections 118 and 120 each include a top-opened cylindrical polishing tank 152 for accommodating a polishing liquid (an electrolyte or a chemical agent) 150, and a substrate holder 156 for detachably holding the substrate W with its front surface downward by a holding member 154, such as an electrostatic chuck, at such a position that the substrate W covers the top opening of the polishing tank 152. On the inside of the polishing tank 152, a plate 158 in a flat plate shape, which makes a cathode electrode when immersed in the polishing liquid 150 with the substrate as an anode, is disposed horizontally. The other construction of the electrical or chemical polishing sections 118 and 120 is the same as the etching section 20 shown in FIG. 3, and hence a description thereof is herein omitted, with the same reference numerals being given to the same members.

In operation, while the lower surface (polishing surface) of the substrate W, which is held with its front surface downward by the substrate holder 156, is kept in contact with the polishing liquid 150, the substrate W is allowed to rotate together with the substrate holder 156 and, at the time, the plate 158 is allowed to reciprocate, while a given voltage is applied between the plate 158 (cathode) and the substrate W (anode) to pass an electric current therebetween so as to electrolyticaly polish a plated film on the substrate W, whereas a chemical polishing is effected by stopping the electric current.

Thus, in the electrolytic or chemical polishing sections 118 and 120, the surface of the substrate W can be chemically polished merely by immersing the substrate surface in the polishing liquid (a chemical agent) 150 due to the corrosion effect of the polishing liquid, whereas the surface of the substrate W can be electrolyticaly polished by immersing the plate 158 and the substrate W in the etching liquid (an electrolyte) 150 and applying a given voltage therebetween.

Figure 17:
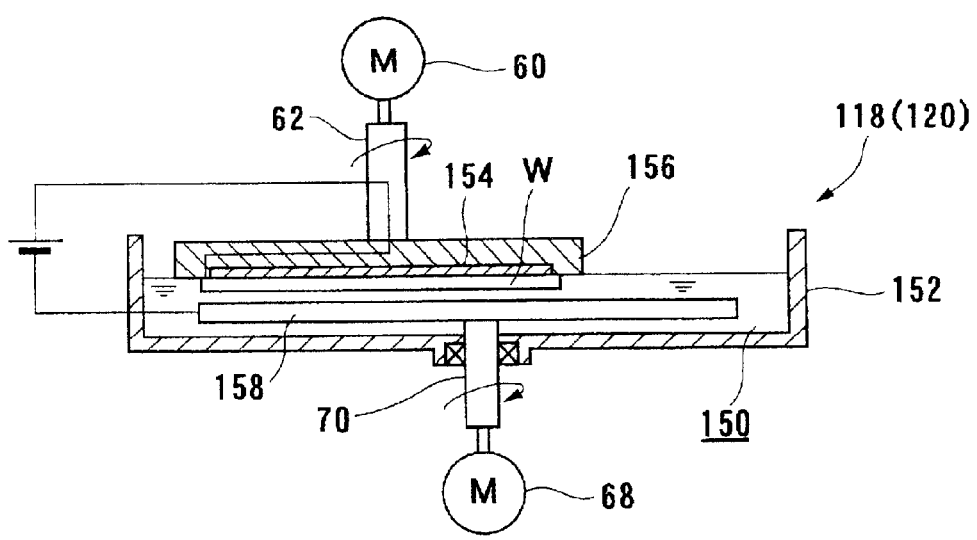
FIG. 17 is a schematic view of another embodiment of an electrolytic or chemical polishing section.

FIG. 17 shows another embodiment of electrolytic or chemical polishing sections 118 and 120, each of which employs a plate 158 having a larger diameter than that of the substrate W. The plate 158 is connected at its center to the upper end of a drive shaft 70 that is connected to a motor 68, so that it is allowed to rotate by the actuation of the motor 68.

Figure 18:
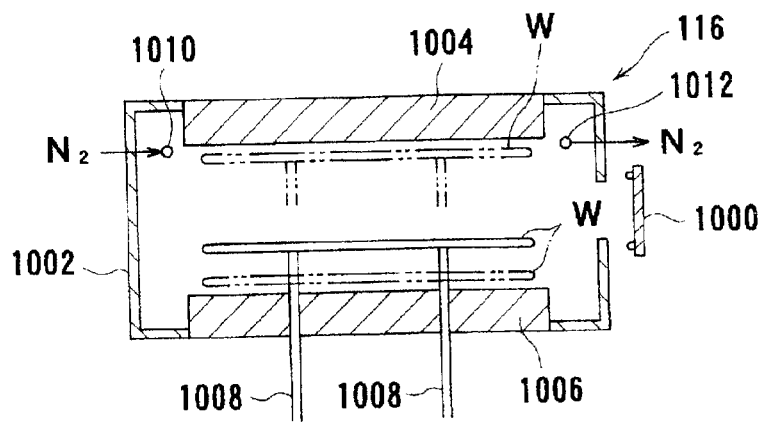
FIG. 18 is a longitudinal sectional view of an annealing section.
Figure 19:
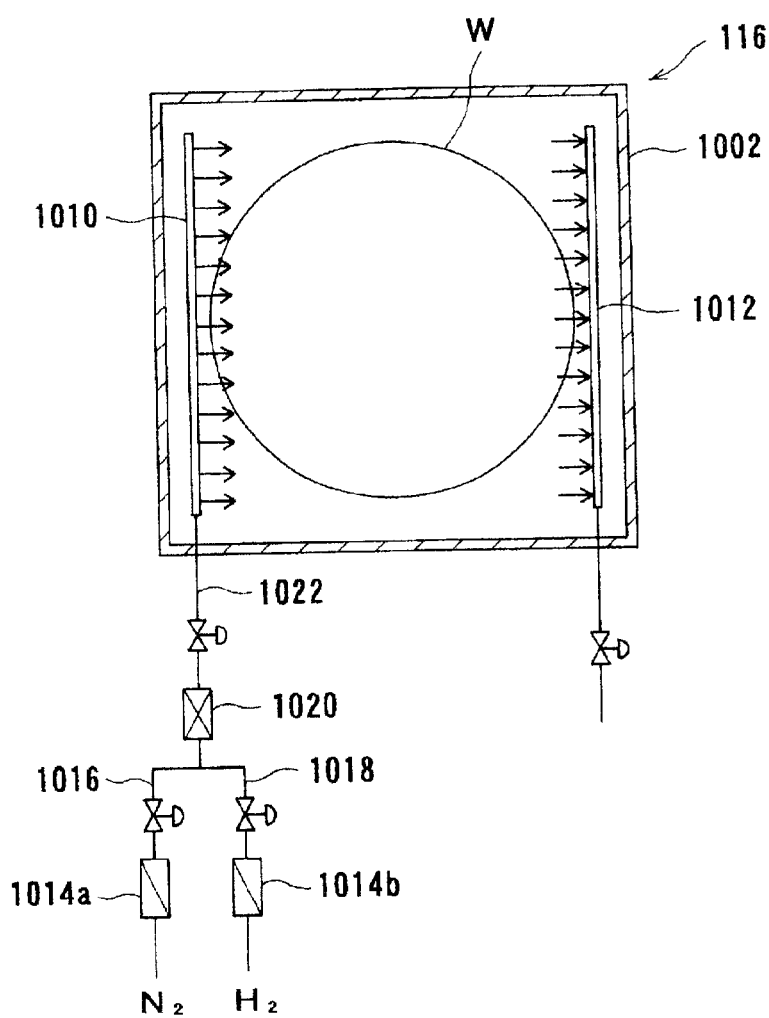
FIG. 19 is a horizontal sectional view of the annealing section.
Figure 20:
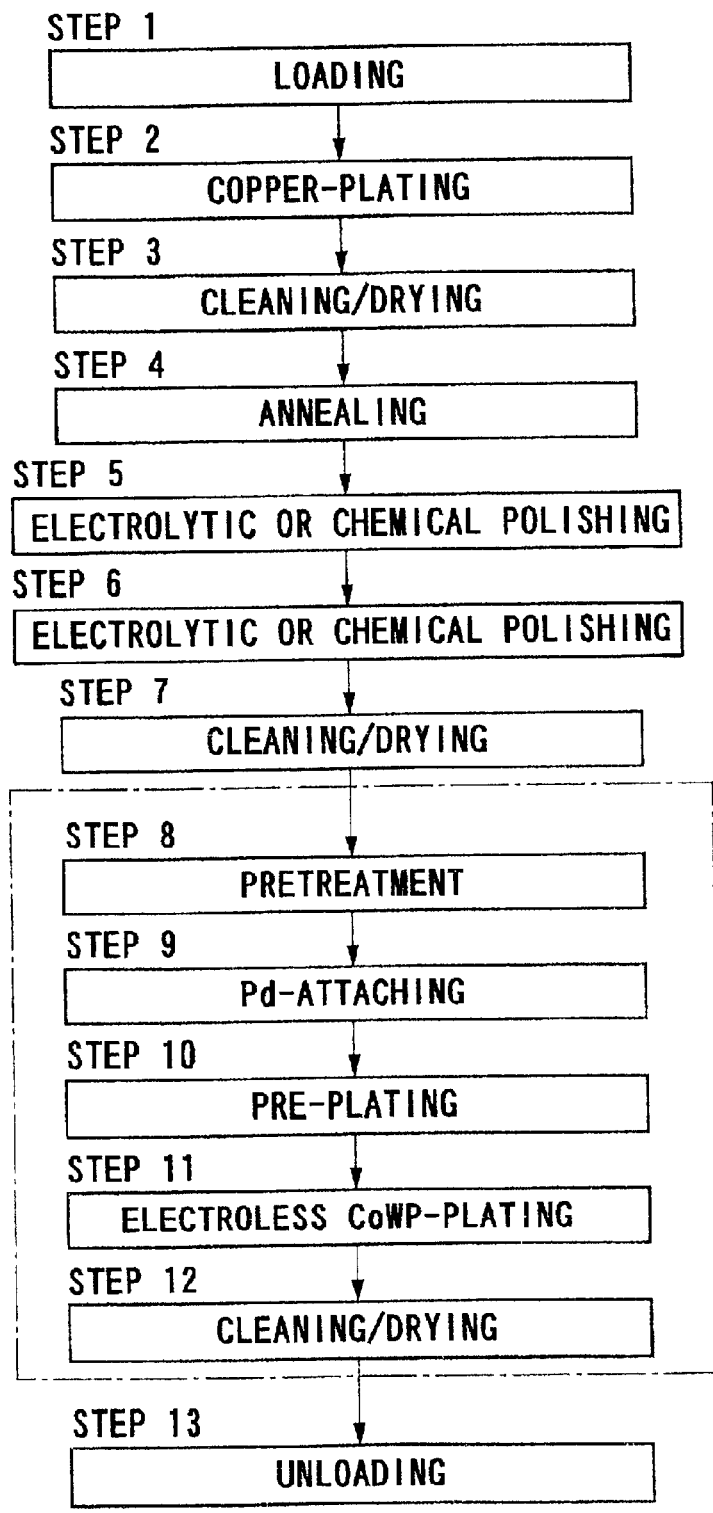
FIG. 20 is a flow diagram showing the flow of process steps in the interconnects-forming apparatus of FIG. 14.

FIGS. 18 and 19 show the annealing section 116. The annealing section 116 comprises a chamber 1002 having a gate 1000 for taking in and out the substrate W, a hot plate 1004 disposed at an upper position in the chamber 1002 for heating the substrate W to e.g. 400° C., and a cool plate 1006 disposed at a lower position in the chamber 1002 for cooling the substrate W by, for example, flowing a cooling water inside the cool plate 1006. The annealing section 1002 also has a plurality of vertically movable elevating pins 1008 penetrating the cool plate 1006 and extending upward and downward therefrom for placing and holding the substrate W on them. The apparatus further includes a gas introduction pipe 1010 for introducing an antioxidant gas between the substrate W and the hot plate 1004 during annealing, and a gas discharge pipe 1012 for discharging the gas which has been introduced from the gas introduction pipe 1010 and has flowed between the substrate W and the hot plate 1004. The pipes 1010 and 1012 are disposed on both sides of the hot plate 1004.

The gas introduction pipe 1010 is connected to a mixed gas introduction line 1022, which is connected to a mixer 1020, where a $N_2$ gas introduced through a $N_2$ gas introduction line 1016 containing a filer 1014a, and a $H_2$ gas introduced through a $H_2$ gas introduction line 1018 containing a filter 1014b, are mixed to form a mixed gas which flows through the line 1022 into the gas introduction pipe 1010.

In operation, the substrate W, which has been carried in the chamber 1002 through the gate 1000, is held on the elevating pins 1008 and the elevating pins 1008 are raised up to a position at which the distance between the substrate W held on the elevating pins 1008 and the hot plate 1004 becomes e.g. 0.1–1.0 mm. The substrate W is then heated to e.g. 400° C. through the hot plate 1004 and, at the same time, the antioxidant gas is introduced from the gas introduction pipe 1010 and the gas is allowed to flow between the substrate W and the hot plate 1004 while the gas is discharged from the gas discharge pipe 1012, thereby annealing the substrate W while preventing its oxidation. The annealing treatment may be completed in about several tens of seconds to 60 seconds. The heating temperature of the substrate W may arbitrarily be selected in the range of 100–600° C.

After the completion of the annealing, the elevating pins 1008 are lowered down to a position at which the distance between the substrate W held on the elevating pins 1008 and the cool plate 1006 becomes e.g. 0–0.5 mm. By introducing a cooling water into the cool plate 1006, the substrate W is cooled by the cool plate 1006 to a temperature of 100° C. or lower in e.g. 10–60 seconds. The cooled substrate W is transported to the next step.

A mixed gas of $N_2$ gas with several % of $H_2$ gas is used as the above antioxidant gas. However, $N_2$ gas may be used singly.

Figure 32B:
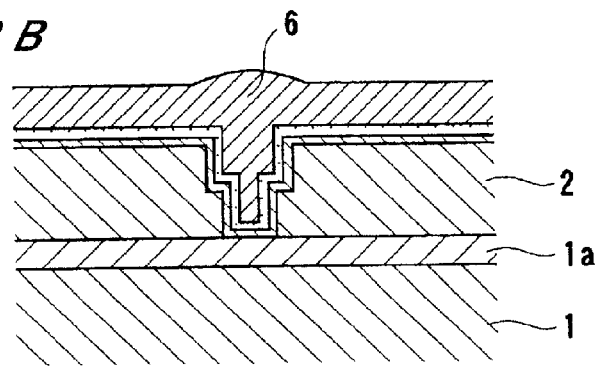

An example of the process for forming interconnects will now be described by referring to FIG. 20 and FIGS. 21A to 21D. This example illustrates a case where the surface of the substrate W, which is plated with copper to form a plated copper film 6 as shown in FIG. 32B, is flattened without resorting to a CMP processing to thereby form copper interconnects, and the surface of the copper interconnects is subjected to a cap-plating treatment.

First, the substrate W having a seed layer 7 (see FIG. 32A) as an outermost layer is taken out one by one from the loading/unloading section 111 by the transport device 126 and is transported to the copper-plating section 112 (step 1).

Figure 21A:
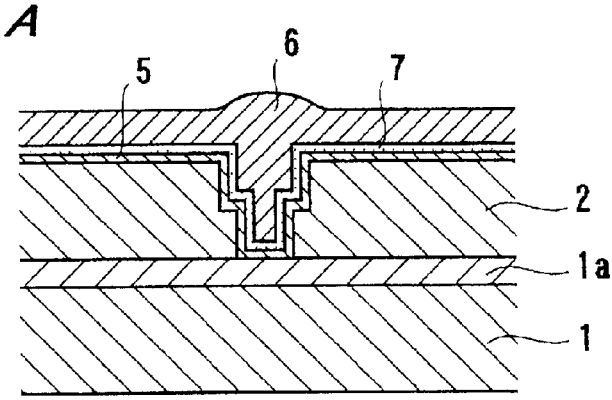
FIGS. 21A through 21D are diagrams illustrating steps of the formation of copper interconnects according to the process flow of FIG. 20.

Next, plating with copper by e.g. electroplating is carried out onto the substrate W in the copper-plating section 112, thereby forming a plated copper film 6 on the surface of the substrate W as shown in FIG. 21A (step 2). In carrying out the plating, with a primary view to reducing a depression in the plated copper film caused by the presence of the large hole, there is used, as the plating liquid 130 shown in FIG. 15, a plating liquid having a high bottom-up composition with a high copper sulfate concentration and a low sulfuric acid concentration, e.g. a composition of 100–300 g/l of copper sulfate and 10–100 g/l of sulfuric acid. An additive for improving the bottom-up property may be added to the plating liquid. By the term "bottom-up property" is herein meant a property of inducing a bottom-up growth of plating in the large hole.

After the completion of plating, the plated substrate W is transported to the cleaning/drying section 114 for cleaning and drying (step 3), and the substrate W is then transported to the annealing section 116 where the substrate W having the plated copper film 6 thereon is heat-treated to anneal the copper film 6 (step 4). Thereafter, the annealed substrate W is transported to the first electrolytic or chemical polishing section 118.

Next, in the first electrolytic or chemical polishing section 118, a first-stage electrolytic or chemical polishing is carried out to the surface (plated surface) of the substrate W to polish and remove the copper film 6 formed on the surface of the substrate W (step 5). In the case of the electrolytic etching, a polishing liquid is used, as the polishing liquid (electrolyte) 150 shown in FIGS. 16 and 17, which comprises at least one inorganic acid and/or organic acid capable of dissolving copper and at least one thickening agent selected from the group consisting of polyhydric alcohols, high-molecular weight polyhydric alcohols and alkylene glycol alkyl or aryl ethers, and which thus has an increased viscosity by the addition of the thickening agent.

The use of such a polishing liquid 150 having an increased viscosity in the electrolytic etching of the surface of the copper film 6 formed on the substrate W can enlarge the diffusion layer on the substrate, in which a copper complex is present, and therefore can raise the polarization potential and suppress the conductivity of the entire surface of the substrate in the liquid, thereby suppressing the dissolution of copper over the entire substrate surface and/or the movement of copper ions in the liquid and making the surface not sensitive to a minute change in current density, whereby a polished surface endowed with high flatness can be obtained. In this regard, the enlargement of the diffusion layer, the rise in polarization potential and the suppression of conductivity depend largely on the viscosity of the polishing liquid, and the use of the above polishing liquid having an increased viscosity can provide an improved flatness to the polished surface. For obtaining a sufficiently high flatness, the polishing liquid 150 should preferably have a viscosity of 10–100 cP, more preferably 20–60 cP and a conductivity of 1–20 mS/cm, more preferably 5–18 mS/cm. The temperature of the polishing liquid 150 is preferably 0–30° C., more preferably 5–25° C.

Figure 21B:
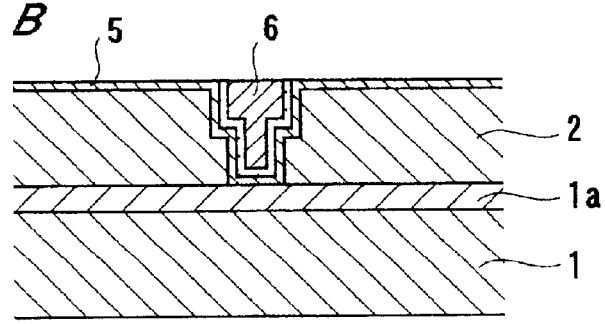

The above electrolytic polishing removes the seed layer 7 on the barrier layer 5 as well as the copper film 6 on the seed layer 7 to thereby expose the surface of the barrier layer 5, and flattens the exposed surface of the barrier layer 5 together with the surface of the copper film 6 filled in the contact hole 3 and the trench 4 for interconnects, as shown in FIG. 21B, and then the polishing process is completed. The electrolytic polishing, during the processing, may be switched to a chemical polishing in the same treatment section.

Phosphoric acid may be mentioned as an example of the inorganic acid capable of dissolving copper. Examples of the organic acid capable of dissolving copper may include citric acid, oxalic acid and gluconic acid. Examples of the polyhydric alcohols as the thickening agent include ethylene glycol, propylene glycol and glycerin. Examples of the high-molecular weight polyhydric alcohols as the thickening agent include polyethylene glycol and polypropylene glycol. Examples of the alkylene glycol alkyl or aryl ethers as the thickening agent include ethylene glycol ethyl, ether, ethylene glycol methyl ether, ethylene glycol propyl ether, ethylene glycol phenyl ether, propylene glycol ethyl ether, propylene glycol methyl ether, propylene glycol phenyl ether and dipropylene glycol monomethyl ether.

A pulse waveform or a PR pulse waveform may be employed as the waveform pulse of the electric current applied in the electrolytic polishing. The use of such a pulse waveform can improve the diffusion of the additive contained in the polishing liquid.

Figure 22:
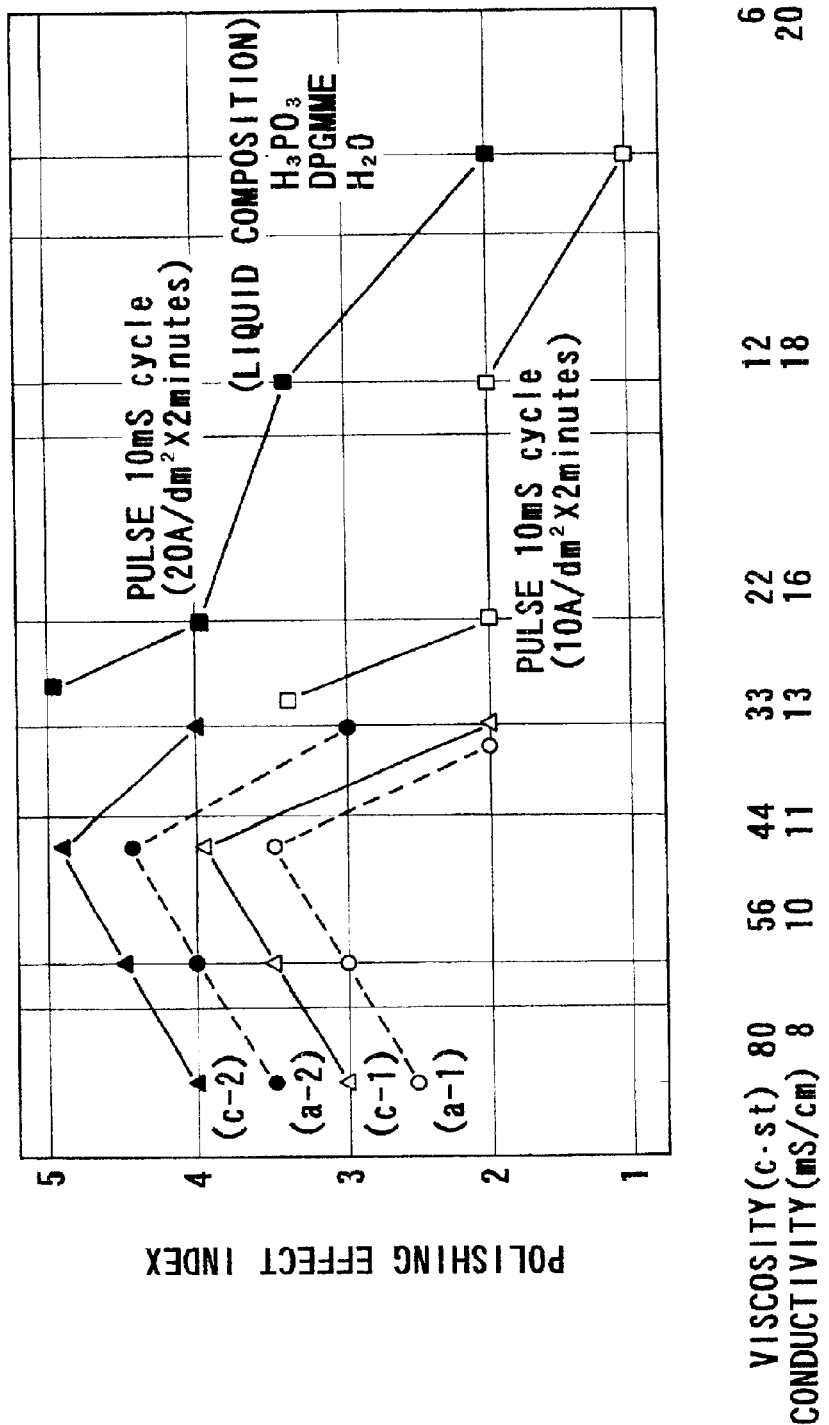
FIG. 22 is a graph showing the relationship between the viscosity and conductivity of a polishing liquid and the polishing effect in an electrolytic or chemical polishing using the polishing liquid.
Figure 23:
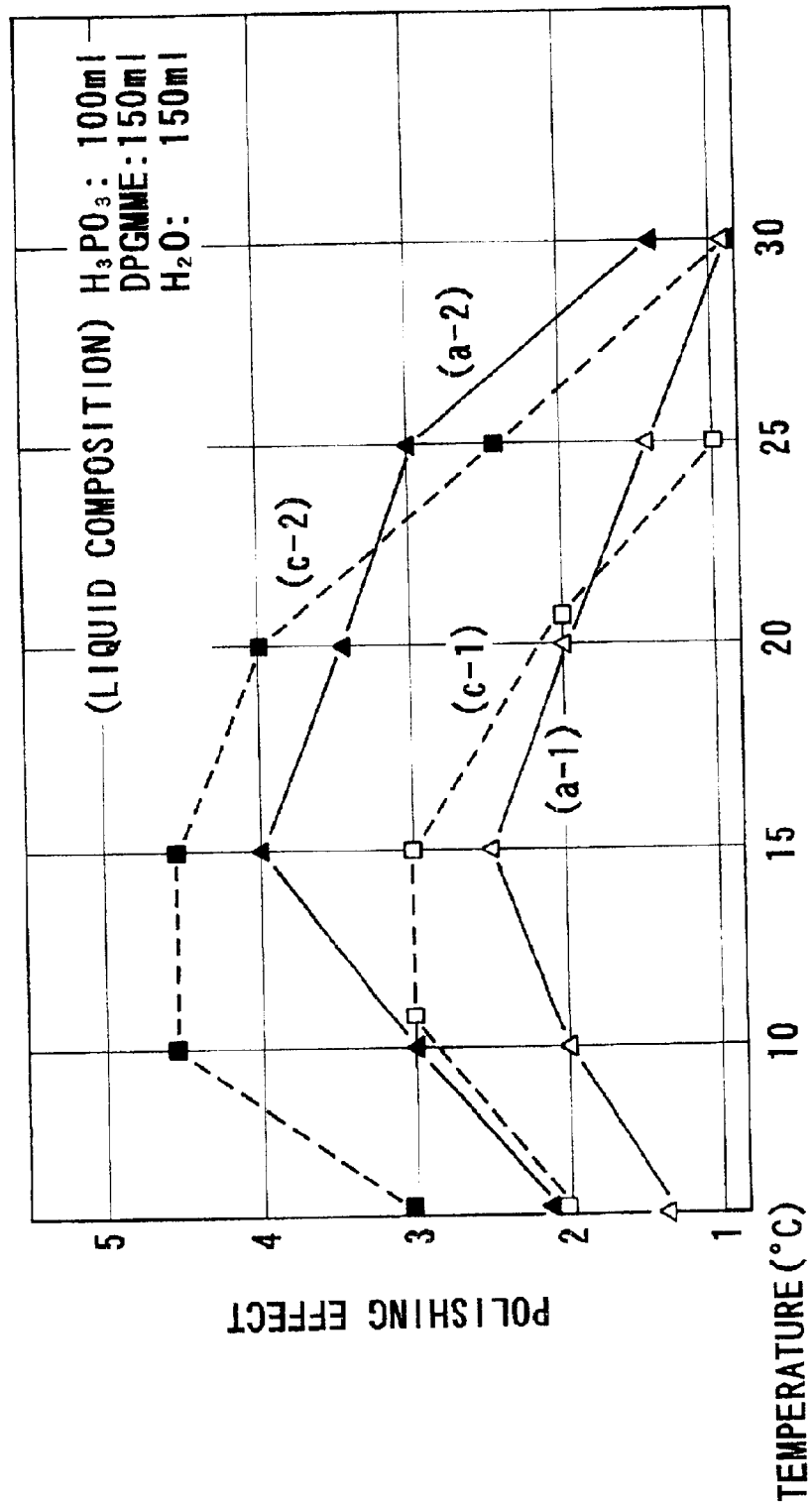
FIG. 23 is a graph showing the relationship between the liquid temperature and the polishing effect in an electrolytic or chemical polishing using the polishing liquid.
Figure 24:
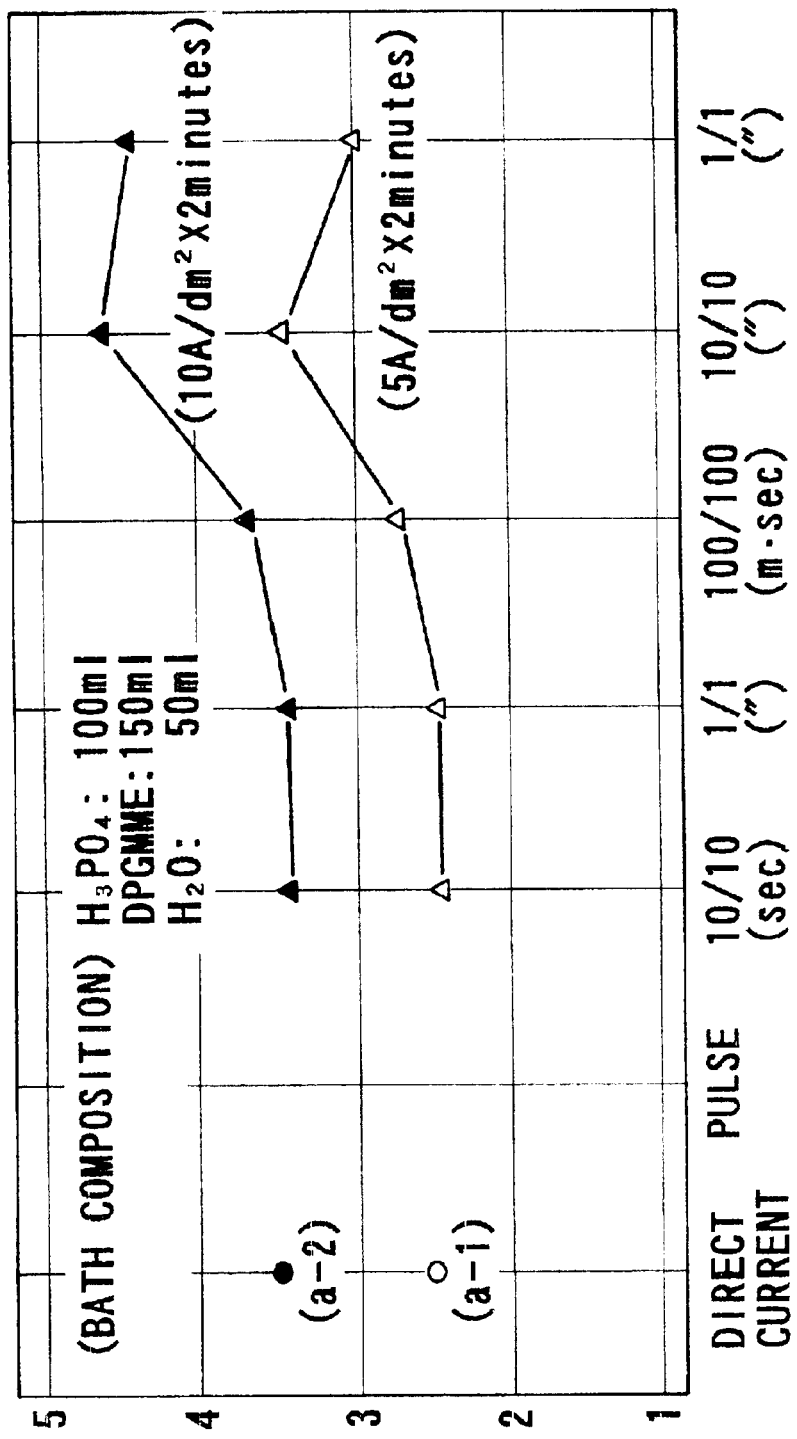
FIG. 24 is a graph showing the relationship between the waveform of current and the polishing effect in an electrolytic or chemical polishing using the polishing liquid.

FIGS. 22 through 24 show the experimental results of electrolytic or chemical polishing carried out by using various polishing liquids. FIG. 22 shows the relationship between the viscosity and conductivity of a polishing liquid and the polishing effect; FIG. 23 shows the relationship between the liquid temperature and the polishing effect; and FIG. 24 shows the relationship between the waveform of current and the polishing effect. In these Figures, a-1, a-2, c-1 and c-2 denote the following charge conditions shown in Table 1.

TABLE 1

| | |
|---|---|
| a-1 | DC 5 A/dm$^2$ |
| a-2 | DC 10 A/dm$^2$ |
| c-1 | Pulse 5 A/dm$^2$ × 10 mS OFF × 10 mS |
| c-2 | Pulse 10 A/dm$^2$ × 10 mS OFF × 10 mS |

FIG. 22 shows the results of a polishing experiment in which various polishing liquids, which mutually consist of phosphoric acid as a base liquid, dipropylene glycol monomethyl ether as a thickening agent, and water, but have different viscosities due to different contents of the water, were used. As can be seen from FIG. 22, the polishing effect increases with an increase in the liquid viscosity and with a decrease in the liquid conductivity, and the polishing effect index shows its peak at the viscosity 20–60 cP and the conductivity 17–9 mS/cm.

FIG. 23 shows the results of a polishing experiment in which polishing liquids, which mutually consist of 100 ml of phosphoric acid, 150 ml of dipropylene glycol monomethyl ether and 150 ml of water, but differ in the liquid temperature, were used. It can be seen from FIG. 23 that the polishing effect varies with the various electrolytic conditions employed, and shows a high effect at the liquid temperature of 30° C. or lower, especially 25° C. or lower.

FIG. 24 shows the results of a polishing experiment in which a polishing liquid consisting of 100 ml of phosphoric acid, 150 ml of dipropylene glycol monomethyl ether and 50 ml of water, was used and the pulse waveform was varied. In FIG. 24, 10/10 sec indicates 10 sec at ON and 10 sec at OFF. FIG. 24 shows that a pulse waveform of 1 mS-1 sec ON/OFF, especially of 1 mS–100 mS ON/OFF, is preferred.

During the polishing process, in the case of the electrical or chemical polishing section 118 shown in FIG. 16, the substrate W is allowed to rotate while the plate 158 is allowed to reciprocate. In the case of electrolytic or chemical polishing section 118 shown in FIG. 17, the substrate W and the plate 158 are both allowed to rotate in the same direction. In either case, the substrate W and the plate 158 are thus made to move relatively so as to make the velocities of the substrate at its various points relative to the plate 158 closer to one another, thereby making the flow conditions of the polishing liquid between the various points of the substrate and the plate 158 uniform so as not to make a singular point in the flow of polishing liquid. This can prevent the plated film on the substrate W from being locally etched excessively to worsen the flatness of the substrate surface. This holds also for the subsequent electrolytic or chemical polishing carried out in the second electrolytic or chemical polishing section 120.

The substrate, which has undergone the first-stage electrolytic or chemical polishing treatment in the first electrolytic or chemical polishing section 118, is then transported to the second electrolytic or chemical polishing section 120 where the second-stage electrolytic or chemical polishing is carried out to the surface of the substrate (step 6). In case a chemical polishing is carried out as the second-stage polishing, a polishing liquid is used as the polishing liquid (chemical agent) 150 which comprises the polishing liquid having an increased viscosity used in the first electrolytic or chemical polishing (step 5) and added thereto, an additive which can adhere to the surface of copper and chemically suppress the dissolution of copper, or a basic liquid or additive which forms a strong complex with copper or promotes the formation of a passivated film on the surface of copper.

Figure 21C:
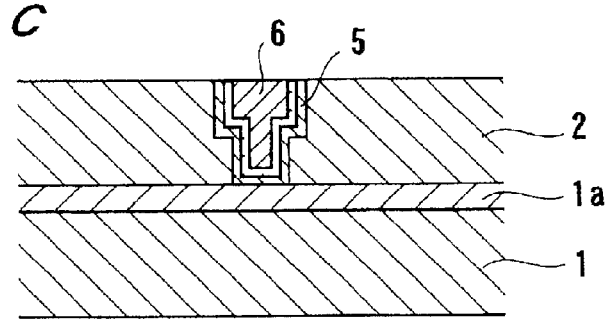

Electrolytic or chemical polishing of the surface of copper film 6 and the surface of the barrier film 5 composed of a conductive material, such as TaN, by the use of the above polishing liquid 150 containing the basic liquid or the additive, can polish the copper film 6 and the barrier film (TaN, Ta, WN, TiN, etc.) 5 evenly at the same polishing rate. The polishing treatment thus removes the barrier layer 5 on the insulating film 2, and flattens the exposed surface of the insulating film 2 together with the surface of the copper film 6 filled in the contact hole 3 and the trench 4 for interconnects, as shown in FIG. 21C, and then the second-stage electrolytic or chemical polishing process is completed.

Specific examples of the additive which can electrochemically suppress the dissolution of copper may include imidazole, benzimidazole, benzotriazole and phenacetin. Chromic acid may be mentioned as an example of the basic liquid which promotes the formation of a passivated film on the surface of copper. ETDA and quinaldin may be mentioned as examples of the additive, for forming a strong complex with copper, and pyrophosphoric acid may be mentioned as an example of the basic liquid, for forming a strong complex with copper.

As described above, the electrolytic and/or chemical polishing treatment can effectively remove the unnecessary copper film 6 on the insulating film 2 such as an oxide film or a film of low-K material, together with the barrier film 5, and can successfully flatten the surface of the insulating film 2 and the surface of the copper film 6 filled in the contact hole 3 and the trench 4 for interconnects. A CMP treatment can therefore be omitted.

Figure 21D:
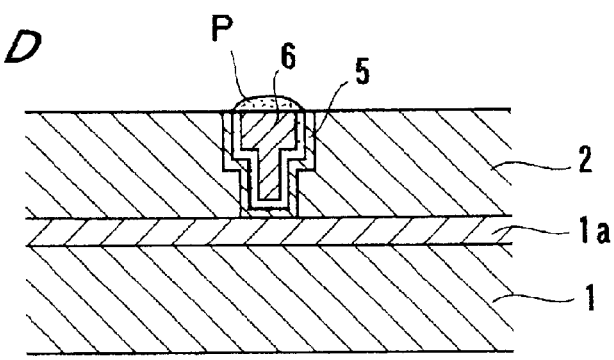

After the completion of the second-stage electrolytic or chemical treatment, the substrate W is transported to the cleaning/drying section 122 for cleaning and drying (step 7), and is then transported to the pretreatment section 124a in the cap-plating treatment section 124, where the substrate is subjected to a pretreatment, for example, additional cleaning of the substrate surface (step 8. Then, in the Pd-attaching treatment section 124, Pd is attached to the surface of the copper film 6 to activate the exposed surface of the copper film 6 (step 9). The substrate is then subjected to a pre-plating treatment, for example, a neutralizing treatment, in the pre-plating treatment section 124c (step 10). Thereafter, the substrate is transported to the electroless CoWP-plating section 124d, where selective electroless plating with CoWP is carried out onto the activated surface of the copper film 6 so as to cover and protect the exposed surface of the copper film 6 with a CoWP film P as shown in FIG. 21D (step 11). A plating liquid usable in the electroless plating may be, for example, a mixture of a cobalt salt and a tangstic salt, which contain as additives a reducing agent, a complexing agent, a pH buffer and a pH adjusting agent. Alternatively, plating covering may be effected by subjecting the exposed surface after the polishing to electroless Ni—B plating so as to selectively form a protective film (plated film) P of Ni—B alloy on the exposed surface of the interconnects 6, thereby protecting the interconnects 6. The thickness of the protective film P is generally in the range of 0.1–500 nm, preferably 1–200 nm, more preferably 10–100 nm.

The electroless Ni—B plating for forming the protective film P may be carried out by using, for example, a plating liquid containing nickel ions, a complex agent for nickel ions, an alkylamine borane or a borohydride as a reducing agent for nickel ions, and TMAH (tetramethyl ammonium hydroxide) as a pH adjusting agent for adjusting the liquid pH in the range of 5–12.

After the completion of the cap-plating treatment, the substrate W is transported to the cleaning/drying section 124e for cleaning and drying (step 12), and the substrate W is then returned to the cassette of the loading/unloading section 111 by the transporting device 126 (step 13).

Though the selective electroless CoWP plating has been described above as an example of the cap-plating treatment which is carried out onto the activated exposed surface by attaching Pd, in advance, of the copper film 6 with a CoWP film selectively, the cap-plating treatment of the present invention, of course, is not limited to this specific example.

Figure 25:
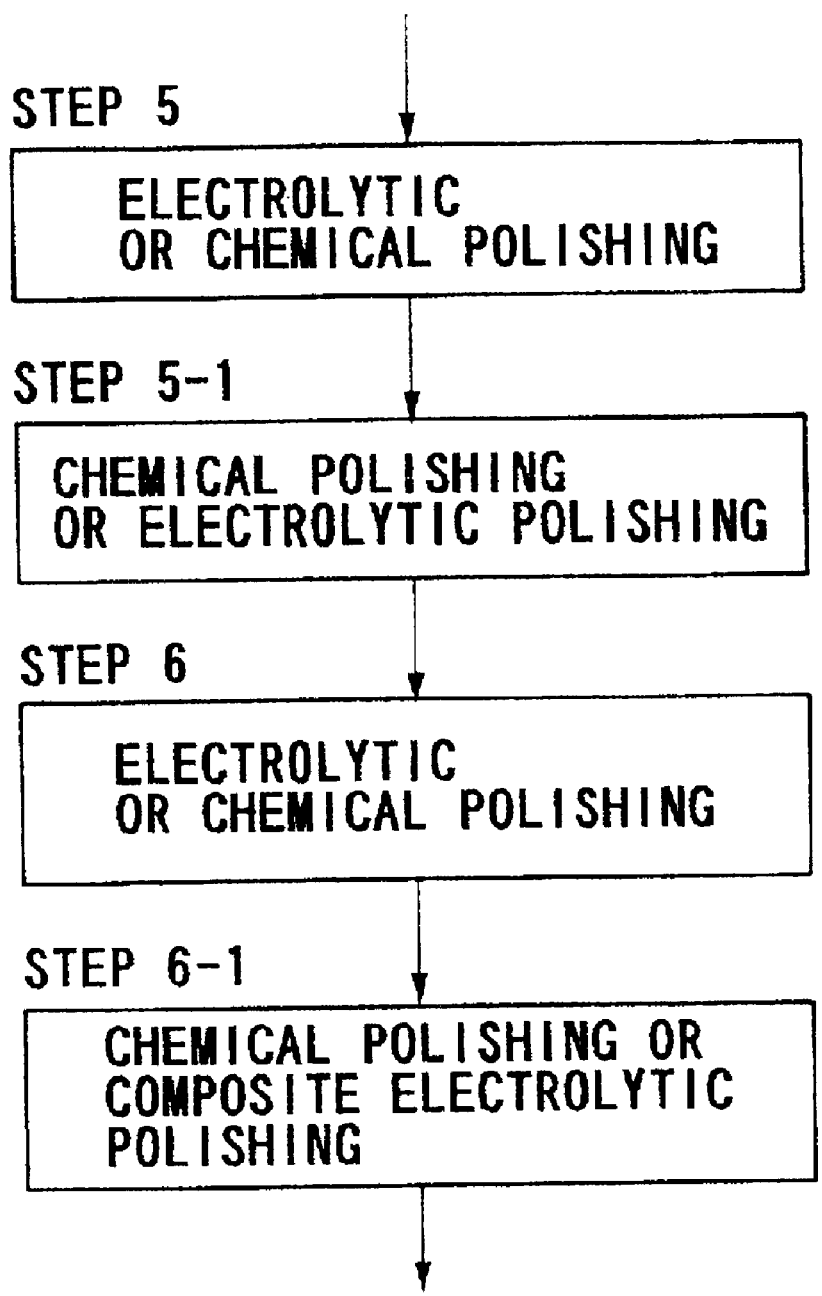
FIG. 25 is a flow diagram showing the flow of process steps that are to be added to the process steps of FIG. 20.

As shown in FIG. 25, it is preferred in the present invention to additionally carry out a chemical polishing or an electrolytic polishing (step 5-1) between the electrolytic or chemical polishing of step 5 and the electrolytic or chemical polishing of step 6, and a chemical polishing or a composite electrolytic polishing (step 6-1) between the electrolytic or chemical polishing of step 6 and cleaning/drying treatment of step 7.

Figure 26A:
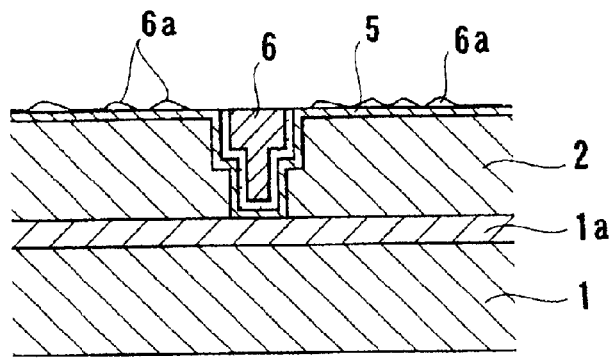
FIGS. 26A through 26C are diagrams illustrating the formation of copper interconnects according to the process flow of FIG. 25.

In this regard, there is a case where in the electrolytic polishing of the surface of the substrate W for removing the copper film 6 formed thereon (step 5), a copper 6a still remains unremoved on the barrier film 5, as shown in FIG. 26, due to the polishing conditions, etc. If the electrolytic polishing is continued to such a substrate, only the copper in the hole and the trench for interconnects is polished whereas the copper 6a on the barrier film is left unremoved.

Figure 26B:
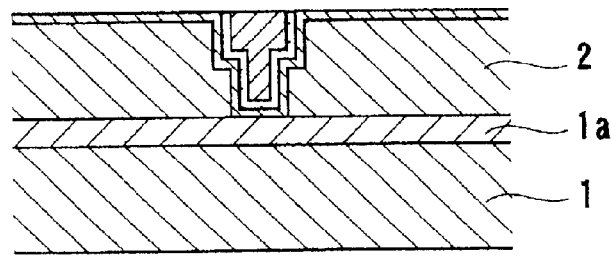

In order to overcome the drawback in the above case, the electrolytic polishing (step 5) can be shifted to a chemical polishing (step 5-1) by shutting off the power source to stop applying a given voltage between the plate 158 and the substrate W, and by using the polishing liquid used in the electrolytic polishing as a chemical agent, whereby the copper 6a remaining on the surface of the barrier layer 5 can be removed as shown in FIG. 26B.

Though the electrolytic polishing (step 5) and the chemical polishing (step 5-1) are carried out in the same polishing tank using the same polishing liquid in the above example, it is also possible to carry out a polishing in a separate polishing tank, either by a chemical polishing using e.g. a polishing liquid (chemical agent) containing an additive which, due to the effect of the additive that preferentially adheres to a high-current density area, can preferentially remove the remaining copper-film 6a, or by an electrolytic polishing using the same polishing liquid (electrolyte). Imidazole, benzimidazole, benzotriazole or phenacetin may be used as the additive.

Figure 26C:
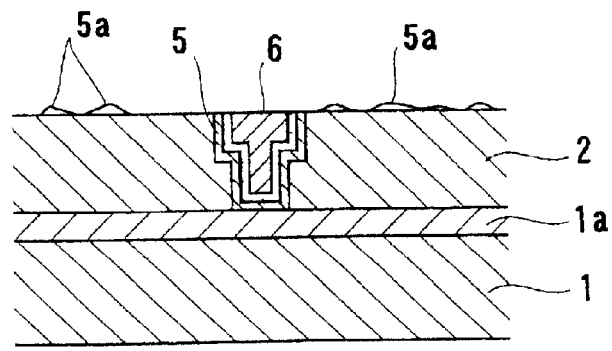

Further, there is also a case where after the chemical or electrolytic polishing of the surface of the substrate W for removing the barrier layer 5 and the copper film 6 (step 6), a conductive material 5a such as TaN, which is the material of the barrier layer 5, still remains on the insulating film 2 such as an oxide film or a film of a low-K material, as shown in FIG. 26c, due to the polishing conditions, etc. This necessitates an additional processing by CMP, that is, a CMP treatment can not be omitted.

In order to overcome the drawback in the above case, electrolytic or chemical polishing is carried out using a polishing liquid containing an additive which has a higher effect than the above described additive added to the electrolyte used in the preceding electrolytic polishing (step 6) using a basic liquid which can passivate copper, electrolytic polishing is carried out using a basic liquid which can passivate copper or under passivating electrolytic conditions, thereby flattening the surface of the insulating film 2 (an oxide film or a film of low-K material) and the surface of the copper film 6 filled in the contact hole 3 and the trench for interconnects, as shown in FIG. 21C.

Instead of such electrolytic or chemical polishing, composite electrolytic polishing may be carried out by passivating the entire surface of the copper layer 6 and the remaining barrier film 6 composed of a conductive material such as TaN, and polishing and removing both the copper and the conductive material at the same time. It is also possible to first carry out the electrolytic or chemical polishing, and subsequently carry out such a composite electrolytic polishing.

Figure 27:
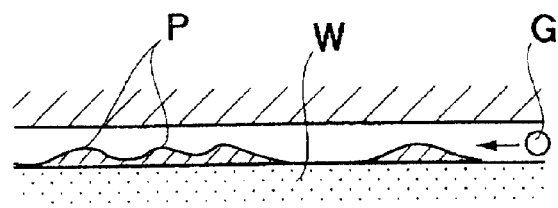
FIG. 27 is a diagram illustrating a composite electrolytic polishing.

The composite electrolytic polishing can be carried out by using a polishing liquid containing abrasive particles. As shown in FIG. 27, the abrasive particles G polish and remove protuberances P of the passivated copper or TaN remaining on the surface of the substrate W, and the barrier layer 5 composed of a conductive material such as TaN, which is present beneath the passivated layer to be polished away by the grains G, is preferentially polished and removed by electrolytic or chemical polishing. The copper and the conductive material such as TaN can thus be polished at the same time. When a finish surface of a surface roughness of 100 Å or less is desired, for example, it is preferred to use an abrasive of a #5000 size or smaller.

Figure 28:
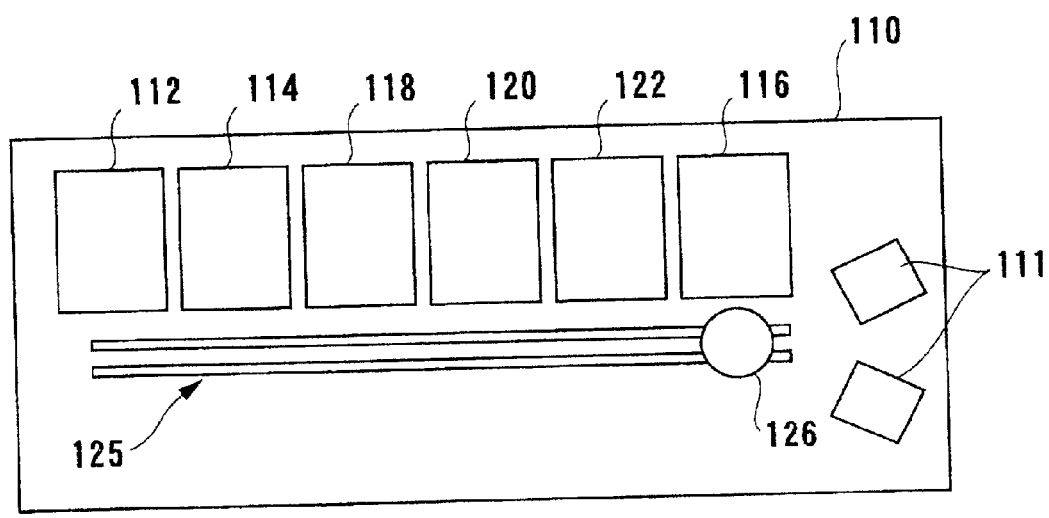
FIG. 28 is a plan view of yet another embodiment of an interconnects-forming apparatus in accordance with the present invention.

FIG. 28 is a plan view of yet another embodiment of an interconnects-forming apparatus in accordance with the present invention. The apparatus comprises a housing 110 that houses the following: loading/unloading sections 111; transport route 125; a copper-plating section 112, a cleaning/drying section 114, a first electrolytic or chemical polishing section 118, a second electrolytic or chemical polishing section 120, a cleaning/drying section 122 and an annealing section 116, which are arranged in the above order along the transport route 125. Further, the apparatus is provided with a transporting device 126 movable along the transport route 125 for transporting a substrate between the above sections. The constructions of the copper-plating section 112, the electrolytic or chemical sections 118 and 120, the annealing section 116, etc. are the same as described above.

Figure 29:
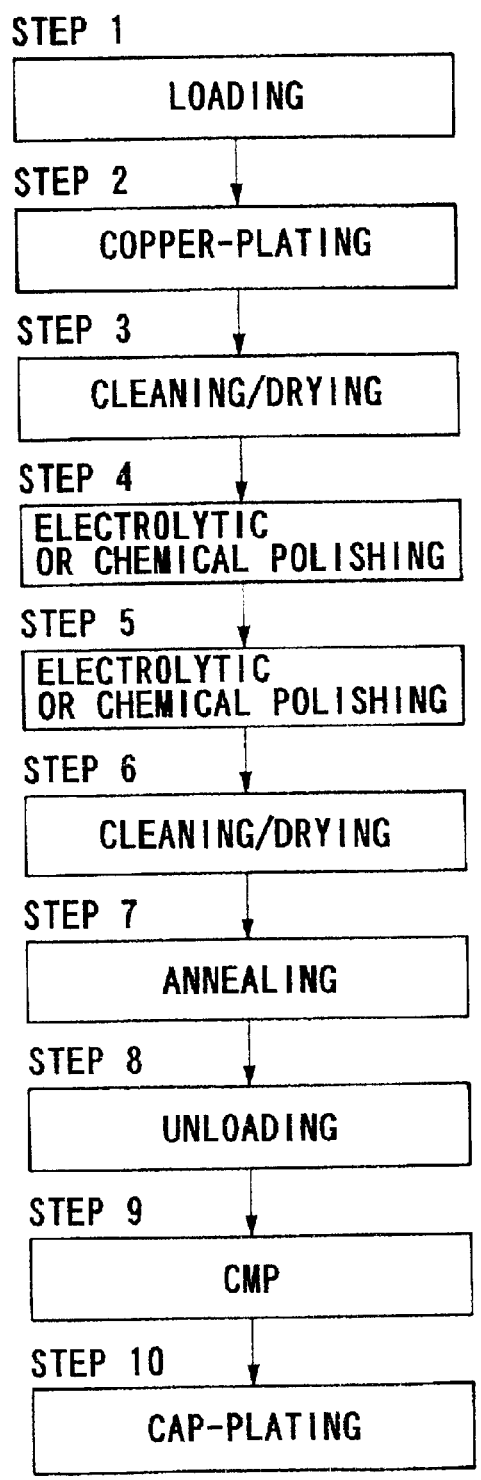
FIG. 29 is a flow diagram showing the flow of process steps in the apparatus of FIG. 28.

An example of the process for forming interconnects will now be described by referring to FIG. 29. This example illustrates a case where the surface of the substrate W, which is plated with copper to form a plated copper film 6 as shown in FIG. 32B, is flattened through a CMP processing to form copper interconnects. Though the final flattening process is thus carried out by CMP, a load upon the CMP is reduced.

First, the substrate W having a seed layer 7 (see FIG. 32A) as an outermost layer is taken one by one from the loading/unloading section 111 by the transport device 126, and is transported to the copper-plating section 112 (step 1).

Next, plating with copper by e.g. electroplating is carried out onto the substrate W in the copper-plating section 112, thereby forming a plated copper film 6 (see FIG. 32B) on the surface of the substrate W (step 2). After the completion of plating, the plated substrate W is transported to the cleaning/drying section 114 for cleaning and drying (step 3), and the substrate W is then transported to the first electrolytic or chemical polishing section 118.

Next, in the first electrolytic or chemical polishing section 118, a first-stage electrolytic or chemical polishing is carried out to the surface (plated surface) of the substrate W to polish and remove the copper film 6 formed on the surface of the substrate W (step 4). In the case of the electrolytic etching, as described above, a polishing liquid is used as the polishing liquid (electrolyte) 150 shown in FIGS. 16 and 17 which comprises at least one inorganic acid and/or organic acid capable of dissolving copper and at least one thickening agent selected from the group consisting of polyhydric alcohols, high-molecular weight polyhydric alcohols and alkylene glycol alkyl or aryl ethers, and which thus has an increased viscosity by the addition of the thickening agent, thereby enlarging the diffusion layer on the substrate, raising the polarization potential and suppressing the conductivity of the entire surface of the substrate in the liquid, to thereby obtain a high flatness of the polished surface.

Next, the substrate which has undergone the first-stage electrolytic or chemical polishing treatment is transported to the second electrolytic or chemical polishing section 120 where the second-stage electrolytic or chemical polishing is carried out to the surface of the substrate (step 5). As described above, in case a chemical polishing is carried out as the second-stage polishing, a polishing liquid is used as the polishing liquid (chemical agent) which comprises the polishing liquid having an increased viscosity used in the electrolytic polishing and added thereto, an additive which can adhere to the surface of copper and chemically suppress the dissolution of copper, or a basic liquid or an additive which forms a strong complex with copper or promotes the formation of a passivated film on the surface of copper, thereby further improving the flatness of the copper film 6 (see FIG. 32B). The chemical polishing treatment may be omitted.

As described above, instead of the chemical polishing, an electrolytic polishing may be carried out by using the same polishing liquid containing the same additive. Further, the chemical polishing may be carried out using the same polishing liquid as used in the preceding electrolytic polishing (step 4), by shutting off the power source for the electrolytic polishing. When the thickness of the copper film 6 has reached the minimum thickness necessary for annealing, e.g. 300 nm, the chemical polishing is terminated, and the substrate is then transported to the cleaning/drying section 122.

The substrate is cleaned and dried in the cleaning/drying section 122 (step 6), and is then transported to the annealing section 116 where the substrate having the plated film 6 thereon is heat-treated to anneal the copper film 6 (step 7). Thereafter, the annealed substrate W is returned to the cassette of the loading/unloading section 111 by the transporting device 126 (step 8).

Figure 32C:
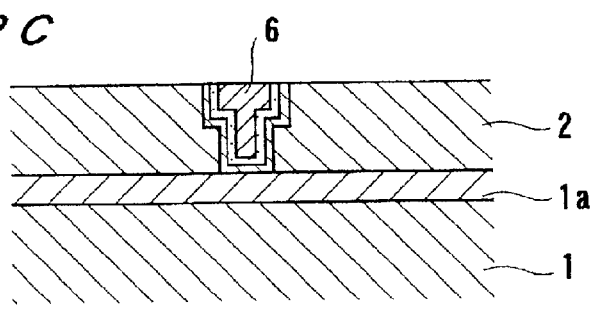
Figure 33:
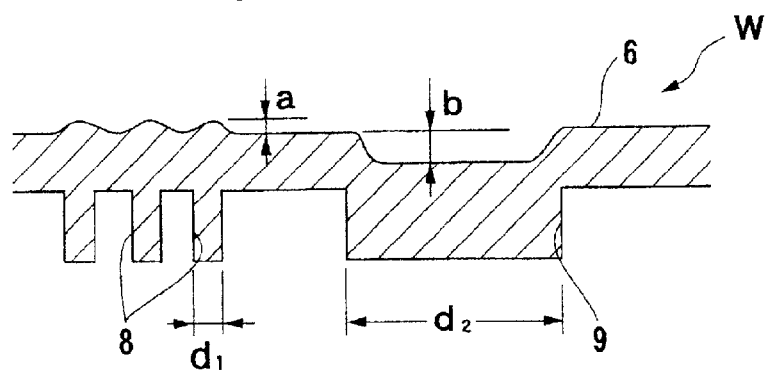
FIG. 33 is a cross-sectional view illustrating the state of a substrate having a problem which has been plated with copper according to a conventional method.

Thereafter, the substrate W is subjected to a CMP treatment in a separate apparatus (step 9) to make the surface of the copper film 6 filled in the contact hole 3 and the trench 4 for interconnects and the surface of the insulating film 2 lie substantially on the same plane, thereby forming interconnects composed of the copper film 6 (see FIG. 32C). If necessary, the above described cap-plating treatment is then carried out (step 10).

According to this embodiment, the flatness of the copper film on a substrate after electrolytic or chemical polishing can be improved, even when fine holes and large holes are co-present in the surface of the substrate, by either carrying out one stage of the electrolytic polishing, or carrying out at least two stages of the electrolytic polishing and the electrolytic or chemical polishing. A later CMP processing can therefore be carried out in a shout time without suffering from dishing.

In order to make the plated surface of the substrate as flat as possible by the electrolytic polishing, it is important to hold the substrate with its best flattened state and use a plate (cathode) having the flattest possible finish, and also to allow them to move relatively while they are kept as close as possible so as not make, within the area of the substrate surface, any singular points in the flow of polishing liquid and in the electric field.

Figure 30:
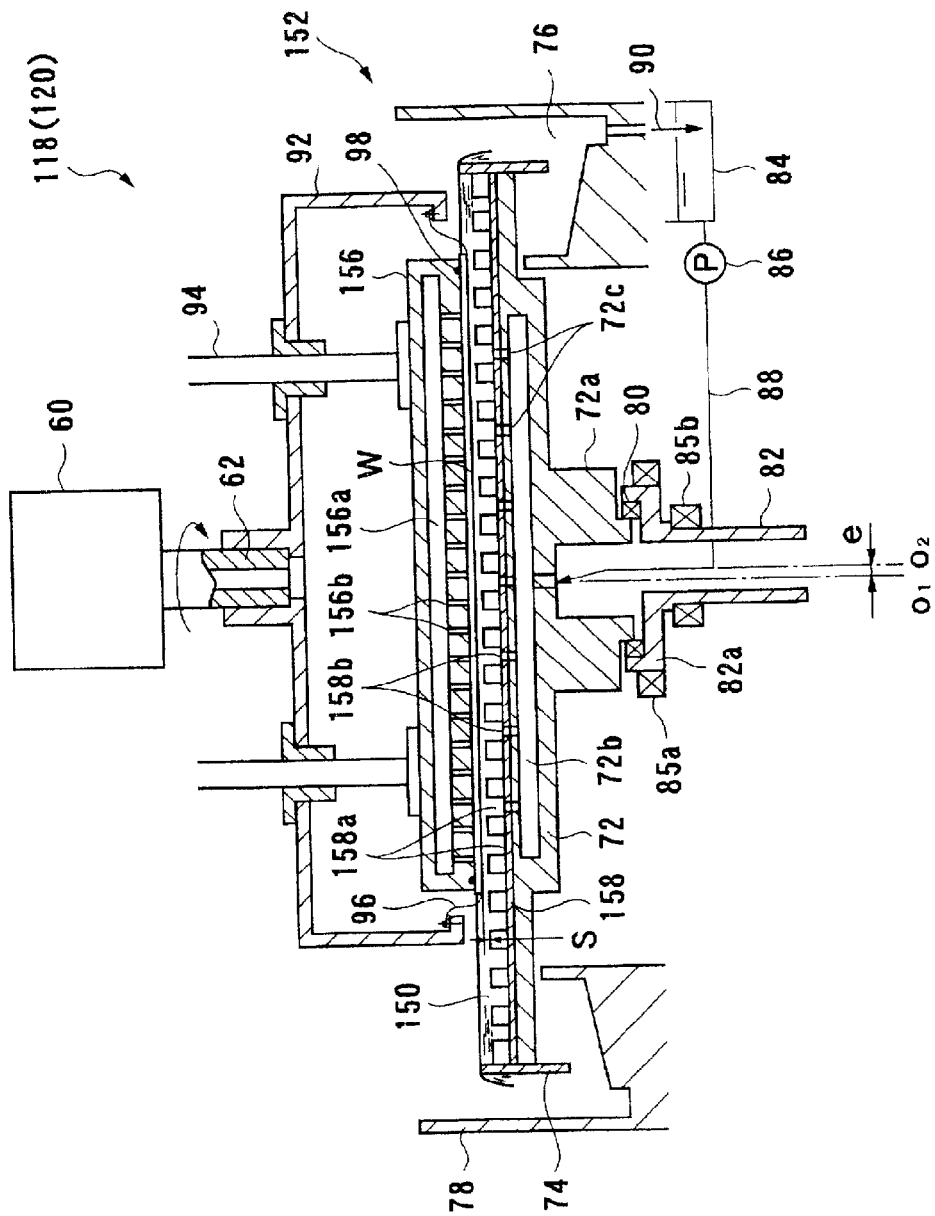
FIG. 30 is a cross-sectional view of yet another embodiment of an electrolytic or chemical polishing section.
Figure 31:
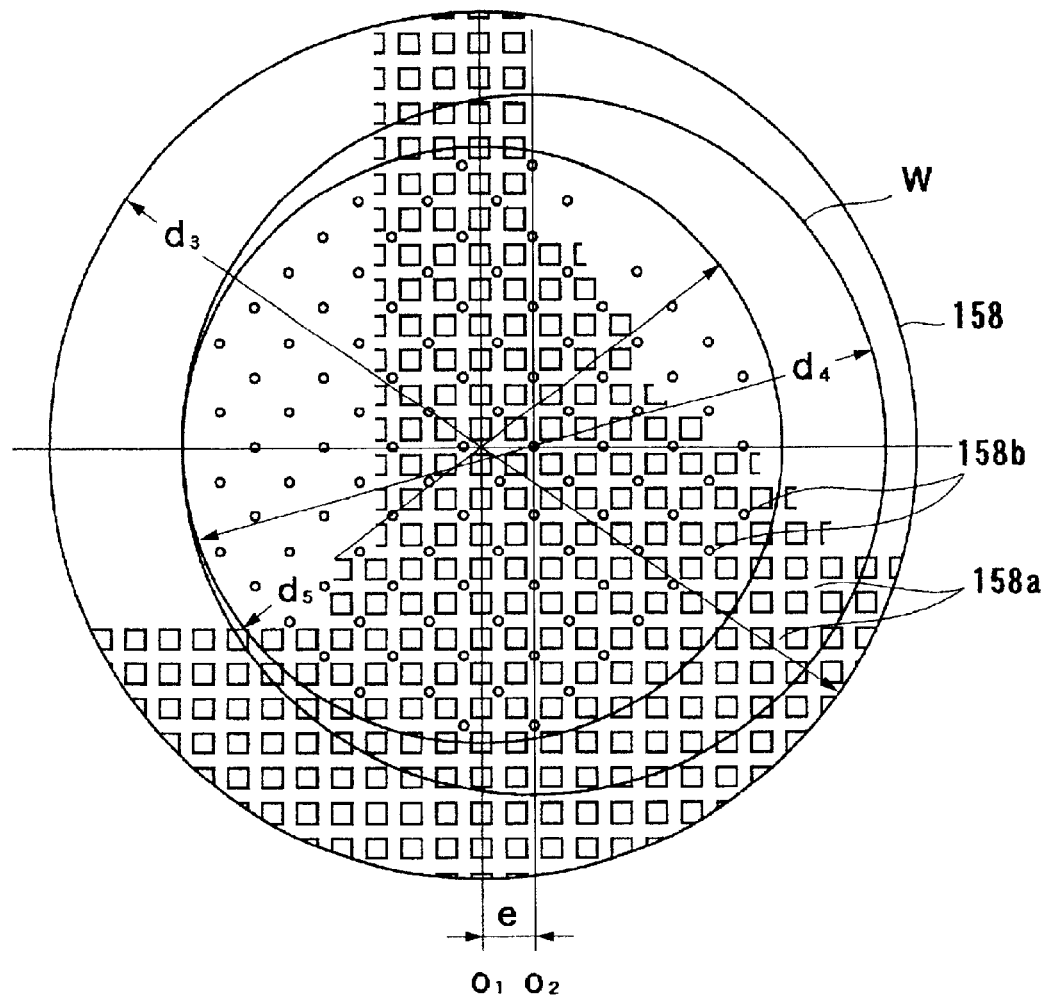
FIG. 31 is a plan view of a plate used in the electrolytic or chemical polishing section of FIG. 30.

FIGS. 30 and 31 show yet another embodiment of electrolytic or chemical polishing sections 118 and 120 which meet the above demands. The polishing section 118 (120) includes a top-opened cylindrical polishing tank 152 for accommodating a polishing liquid 150, and a substrate holder 156 for detachably holding a substrate W with its front surface downward at such a position that the substrate W covers the top opening of the polishing tank 152. A plate (cathode plate) 158 in a plain plate shape, which makes a cathode when immersed in the polishing liquid 150, is disposed horizontally on the upper surface of the bottom plate 72 of the polishing tank 152. The diameter $d_3$ of the plate 158 is determined so that even when the substrate W of diameter $d_4$ makes a scroll movement, the substrate W does not move out of the area of the plate 158; and the diameter $d_5$ of the polishing liquid feed zone, which contains a polishing liquid feed holes 158b, is determined so that even when the substrate W of diameter $d_4$ makes a scroll movement, the polishing liquid feed zone remains within the area of the substrate W. In the surface of the plate 158, there are formed a number of grooves 158a in a lattice from. The substrate holder 156, on its inside, is provided with a vacuum chamber 156a that communicates with a vacuum source, and a number of vacuum attraction holed 156b penetrating downwardly from the vacuum chamber 156a. The other construction of the electrolytic or chemical polishing sections 118 and 120 is the same as the etching section 20 shown in FIGS. 11 and 12, and hence a description thereof is herein omitted, with the same reference numerals being given to the same members.

In carrying out electrolytic polishing in the electrolytic or chemical sections 118 and 120, the etching liquid 150 is fed into the etching tank 152 and, while the etching liquid 150 is overflowing from the overflow weir 74, the bottom plate 72 is allowed to make, together with the plate 158, a scroll movement. Under these conditions, the substrate holder 156 holding the substrate W with its plated surface downward is lowered, while rotating the substrate W, down to a position for polishing.

Under the above conditions, a pulse current as shown in FIG. 13, for example, with a time $t_1$ to be applied of 1 mS–20 mS, preferably 10 mS, and with a current density to be applied of 2–20 A/dm², is applied a plurality of times with stoppage times $t_2$, each time $t_2$ equal to the time $t_1$, being interposed. Upon passing of current, oxidation dissolution of the plated film occurs first at the raised portion of the substrate, and then shifts to the plane portion. Accordingly, passing of current and immediate shutoff of the power feed, when repeated, enables selective etching of the raised portion.

As described hereinabove, according to the interconnects-forming method and apparatus, the flattening process after copper plating is carried out mainly by electrolytic or chemical polishing. Thus, the present invention can omit a CMP treatment entirely or reduce a load upon a CMT treatment and, except for the case of resorting to CMT solely for the finishing processing, can successively carry out a series of flattening steps including annealing in the same housing.

Further, the polishing liquid of the present invention, when used in electrolytic polishing or chemical polishing, can polish a plated copper film formed on the surface of a substrate into a flattened film surface and can polish copper and a conductive material other than copper at the same polishing rate. The polishing method of the present invention can provide the polished surface with excellent flatness and therefore can omit a CMT treatment entirely or reduce a load upon CMP to the least possible extent.

Although certain preferred embodiments of the present invention have been shown and described in detail, it should be understood that various changes and modifications may be made without departing from the scope of the appended claims.

What is claimed is:

1. An apparatus for forming interconnects by forming a copper film on a surface of a substrate to fill copper into fine recesses formed in the surface of the substrate, comprising:

a housing;

a transport route provided in said housing for transporting the substrate; and a copper-plating section, an electrolytic or chemical polishing section, and an annealing section which are disposed along said transport route.

2. The apparatus according to claim 1, further comprising a cleaning section provided in said housing for cleaning the substrate.

3. The apparatus according to claim 1, wherein at least two of said electrolytic or chemical polishing sections are provided for carrying out a first-stage electrolytic or chemical polishing and a second-stage electrolytic or chemical polishing.

4. The apparatus according to claim 2, wherein at least two of said electrolytic or chemical polishing sections are provided for carrying out a first-stage electrolytic or chemical polishing and a second-stage electrolytic or chemical polishing.

5. The apparatus according to claim 1, wherein said electrolytic or chemical polishing section includes:

a substrate holder for holding a substrate with its surface downward;

a cathode plate immersed in a polishing liquid and located facing the lower surface of the substrate held by said substrate holder; and a relative movement mechanism for allowing the substrate held by said substrate holder and said cathode plate to move relatively.

6. The apparatus according to claim 5, further comprising:

a plurality of grooves extending over the full length of said cathode plate in the surface thereof; and a plurality of polishing liquid feed holes formed in said cathode plate for feeding the polishing liquid to said grooves, said plurality of polishing liquid feed holes communicating with said grooves.

7. The apparatus according to claim 5, wherein said relative movement mechanism comprises a substrate-rotating mechanism for rotating the substrate and a cathode plate-moving mechanism for rotating, reciprocating, or eccentrically rotating said cathode plate, or making a scroll motion of said cathode plate.

8. The apparatus according to claim 7, further comprising:

a plurality of grooves extending over the full length of said cathode plate in the surface thereof; and a plurality of polishing liquid feed holes formed in said cathode plate for feeding the polishing liquid to said grooves, said plurality of polishing liquid feed holes communicating with said grooves.

9. The apparatus according to claim 5, wherein said substrate holder is constructed to hold the substrate in a vacuum attraction manner or in an electrostatic chucking manner.

10. The apparatus according to claim 5, wherein said cathode plate is composed of a material having a poor adhesion to copper.

11. The apparatus according to claim 1, further comprising a cap-plating treatment section for forming a protective film which selectively covers and protects the exposed surface of copper interconnects.

12. The apparatus according to claim 11, wherein said cap-plating treatment section includes a Pd-attaching treatment section and an electroless CoWP-plating section.

13. An apparatus for forming interconnects by forming a copper film on a surface of a substrate to fill copper into fine recesses formed in the surface of the substrate, comprising:

a loading/unloading section;

a copper-plating section;

an electrolytic or chemical polishing section; and a transporting device for transporting the substrate.

14. An apparatus for forming interconnects by forming a copper film on a surface of a substrate to fill copper into fine recesses formed in the surface of the substrate, comprising:

a loading/unloading section;

a copper-plating section;

an electrolytic or chemical polishing section;

an annealing section; and a transporting device for transporting the substrate.

15. An apparatus for forming interconnects by forming a copper film on a surface of a substrate to fill copper into fine recesses formed in the surface of the substrate, comprising:

a loading/unloading section;

a copper-plating section;

an electrolytic or chemical polishing section;

an annealing section;

a cleaning section; and a transporting device for transporting the substrate.

16. The apparatus according to claim 2, wherein said cleaning section also carries out drying of the substrate.

17. An apparatus for forming interconnects by forming a copper film on a surface of a substrate to fill copper into fine recesses formed in the surface of the substrate, comprising:

a loading/unloading section;

a copper-plating section;

an electrolytic or chemical polishing section;

an annealing section;

a cleaning section;

a chemical mechanical polishing section; and a transporting device for transporting the substrate.

18. The apparatus according to claim 17, wherein said cleaning section also carries out drying of the substrate.

19. An apparatus for forming interconnects by forming a copper film on a surface of a substrate to fill copper into fine recesses formed in the surface of the substrate, comprising:

a loading/unloading section;

a copper-plating section;

an electrolytic or chemical polishing section;

an annealing section;

a cap-plating treatment section; and a transporting device for transporting the substrate.

20. An apparatus for forming interconnects by forming a copper film on a surface of a substrate to fill copper into fine recesses formed in the surface of the substrate, comprising:

a loading/unloading section;

a copper-plating section;

a first electrolytic or chemical polishing section;

a second electrolytic or chemical polishing section;

an annealing section; and a transporting device for transporting the substrate.

* * * * *

UNITED STATES PATENT AND TRADEMARK OFFICE
CERTIFICATE OF CORRECTION

PATENT NO.   : 6,811,658 B2
DATED        : November 2, 2004
INVENTOR(S)  : Akihisa Hongo et al.

It is certified that error appears in the above-identified patent and that said Letters Patent is hereby corrected as shown below:

Column 26,
Line 25, replace "claim 2" with -- claim 15 --.

Signed and Sealed this

Twenty-second Day of February, 2005

JON W. DUDAS
*Director of the United States Patent and Trademark Office*